(12) United States Patent
Wang et al.

(10) Patent No.: US 12,368,094 B2
(45) Date of Patent: Jul. 22, 2025

(54) SEMICONDUCTOR STRUCTURES AND METHODS OF FORMING THE SAME

(71) Applicant: Taiwan Semiconductor Manufacturing Company, Ltd., Hsin-Chu (TW)

(72) Inventors: Mao-Nan Wang, Kaohsiung (TW); Yuan-Yang Hsiao, Taipei (TW); Chen-Chiu Huang, Taichung (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 428 days.

(21) Appl. No.: 17/832,242

(22) Filed: Jun. 3, 2022

(65) Prior Publication Data
US 2023/0395487 A1 Dec. 7, 2023

(51) Int. Cl.
*H01L 23/522* (2006.01)
*H01L 23/528* (2006.01)

(52) U.S. Cl.
CPC ...... *H01L 23/5223* (2013.01); *H01L 23/5226* (2013.01); *H01L 23/528* (2013.01)

(58) Field of Classification Search
CPC ............. H01L 23/5223; H01L 23/5226; H01L 23/528; H01L 21/76805; H01L 27/0207; H01G 4/38; H01G 4/00; H01G 4/30
See application file for complete search history.

(56) References Cited

U.S. PATENT DOCUMENTS

| | | | | |
|---|---|---|---|---|
| 2006/0189069 | A1* | 8/2006 | Coolbaugh | H01L 23/5223 257/E21.59 |
| 2017/0278712 | A1* | 9/2017 | Nien | H01L 21/32115 |
| 2019/0035676 | A1* | 1/2019 | Yang | H01L 21/76895 |
| 2019/0148072 | A1* | 5/2019 | Fox, III | H01G 4/30 361/301.4 |
| 2019/0165188 | A1* | 5/2019 | Chang | H01L 21/76877 |

(Continued)

OTHER PUBLICATIONS

Hsiao et al., "High Voltage Passive Device Structure" U.S. Appl. No. 17/708,998, filed Mar. 30, 2022, Assignee: Taiwan Semiconductor Manufacturing Company, Ltd., 24 pages of specification, 9 pages of drawings.

*Primary Examiner* — Galina G Yushina
(74) *Attorney, Agent, or Firm* — HAYNES AND BOONE, LLP

(57) ABSTRACT

Passive devices are provided. In an embodiment, a passive device includes a substrate comprising a first region and a second region, a first lower contact feature and a second lower contact feature in a dielectric layer and directly over the first region and the second region, respectively, a first vertical stack of conductive features disposed over the first region, a metal-insulator-metal (MIM) capacitor disposed over the second region and comprising a vertical stack of conductor plates, a first contact via extending through the first vertical stack of conductive features and electrically coupled to the first lower contact feature, and a second contact via extending through a portion of the vertical stack of conductor plates and electrically coupled to the second lower contact feature. A number of conductive features penetrated by the first contact via is different than a number of conductor plates penetrated by the second contact via.

20 Claims, 29 Drawing Sheets

(56) References Cited

U.S. PATENT DOCUMENTS

| | | | |
|---|---|---|---|
| 2019/0305078 A1* | 10/2019 | Wu | H01L 23/5223 |
| 2020/0006183 A1 | 1/2020 | Huang et al. | |
| 2021/0057309 A1* | 2/2021 | Hu | H01L 23/5283 |
| 2021/0098399 A1 | 4/2021 | Huang et al. | |
| 2021/0249350 A1 | 8/2021 | Shen et al. | |
| 2021/0265262 A1* | 8/2021 | Hsiao | H01L 28/60 |
| 2021/0272972 A1* | 9/2021 | Young | H01L 29/785 |
| 2021/0280435 A1* | 9/2021 | Chen | H01L 23/5226 |
| 2021/0376058 A1 | 12/2021 | Shen et al. | |
| 2021/0391413 A1* | 12/2021 | Chen | H10D 1/692 |
| 2022/0068794 A1* | 3/2022 | Welsh | H01L 23/5223 |

* cited by examiner

SEMICONDUCTOR STRUCTURES AND METHODS OF FORMING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the geometry size of IC devices decreases, passive devices that require large surface areas are moved to back-end-of-line (BEOL) structures. Metal-Insulator-Metal (MIM) capacitors are among examples of such passive devices. A typical MIM capacitor includes multiple conductor plates that are insulated from one another by multiple insulator layers. Although existing MIM capacitors and the fabrication process thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
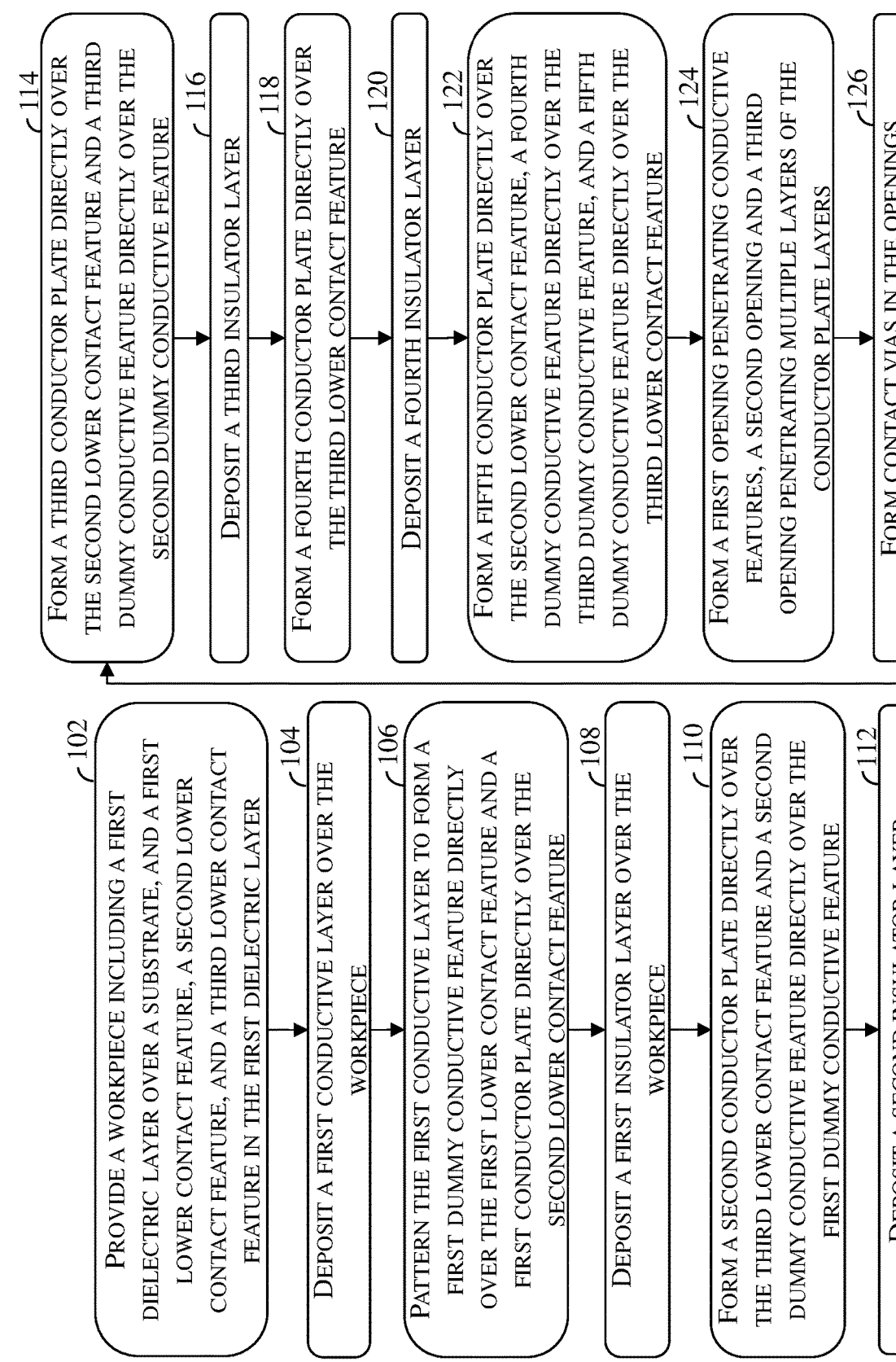
FIG. 1 is a flow chart of a method for fabricating a device structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Metal-Insulator-Metal (MIM) capacitors have been widely used in functional circuits such as mixed signal circuits, analog circuits, Radio Frequency (RF) circuits, Dynamic Random-Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, an MIM capacitor includes a sandwich structure of interleaving metal layers and insulator layers. An example MIM capacitor includes multiple conductor plates, each of which is insulated from an adjacent conductor plate by an insulator layer. More than one contact via is physically and electrically coupled to one or more of the conductor plates. It is observed that sizes (e.g., critical dimensions) of contact vias formed in different device regions may be different. For example, contact vias formed in memory region may be much larger than contact vias formed in logic region. Due to loading effect, during the formation of contact via openings (that contact vias will be formed therein), lower contact features disposed directly under potential larger contact vias may be over etched much more than that of the lower contact features disposed directly under those potential smaller contact vias. The extra over etch of the lower contact features may cause defects, thereby disadvantageously affecting reliability of the device structure.

The present disclosure provides a method of reducing the extent at which the lower contact features disposed directly under the large contact vias would be etched. In an embodiment, a workpiece includes a first lower contact feature in a first region and a second lower contact feature in a second region. During the formation of an MIM capacitor in the second region, multiple conductive features may be formed in the first region along with the formation of conductor plates of the MIM capacitor. After forming the MIM capacitor, the number of conductive features disposed directly over the first lower contact feature in the first region is greater than the number of conductor plates to be electrically coupled to the second lower contact feature in the second region. Providing at least one more conductive feature in the first region would advantageously reduce the extent at which the first lower contact feature would be etched during the formation of large contact vias, thereby reducing defects.

Figure 20:
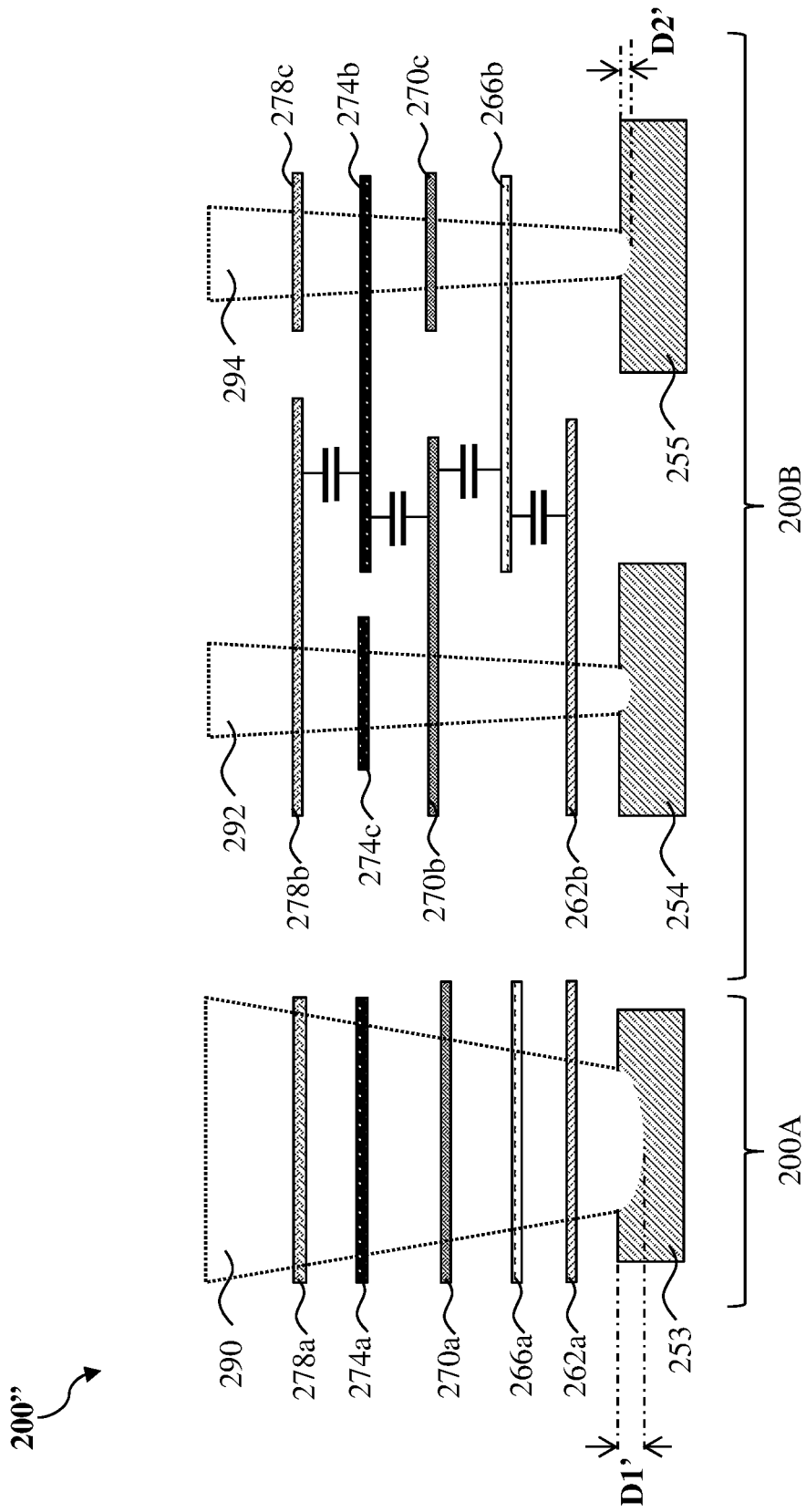
FIG. 20 is a schematic illustration of a second alternative device structure, according to various aspects of the present disclosure.
Figure 21:
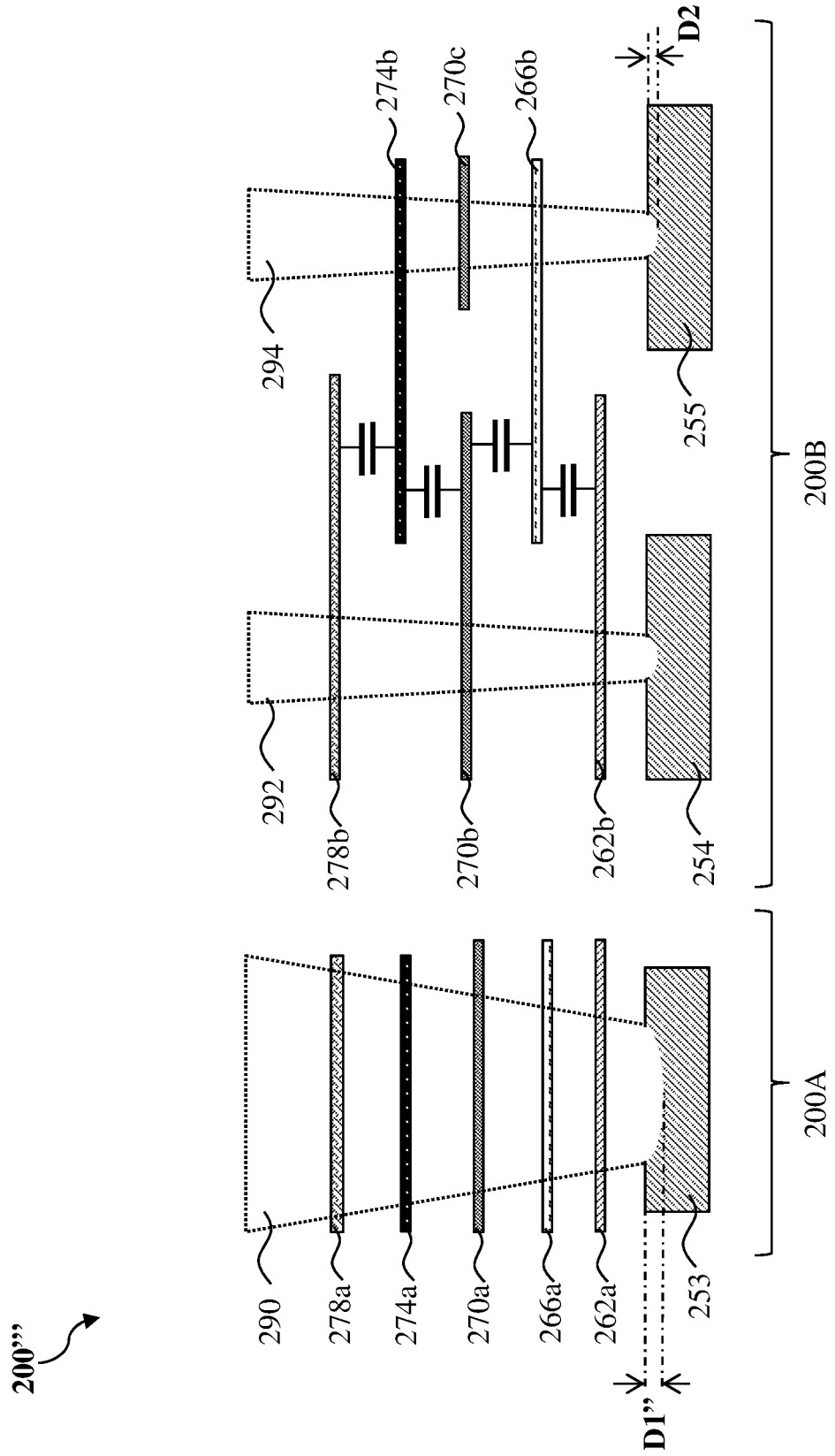
FIG. 21 is a schematic illustration of a third alternative device structure, according to various aspects of the present disclosure.
Figure 22:
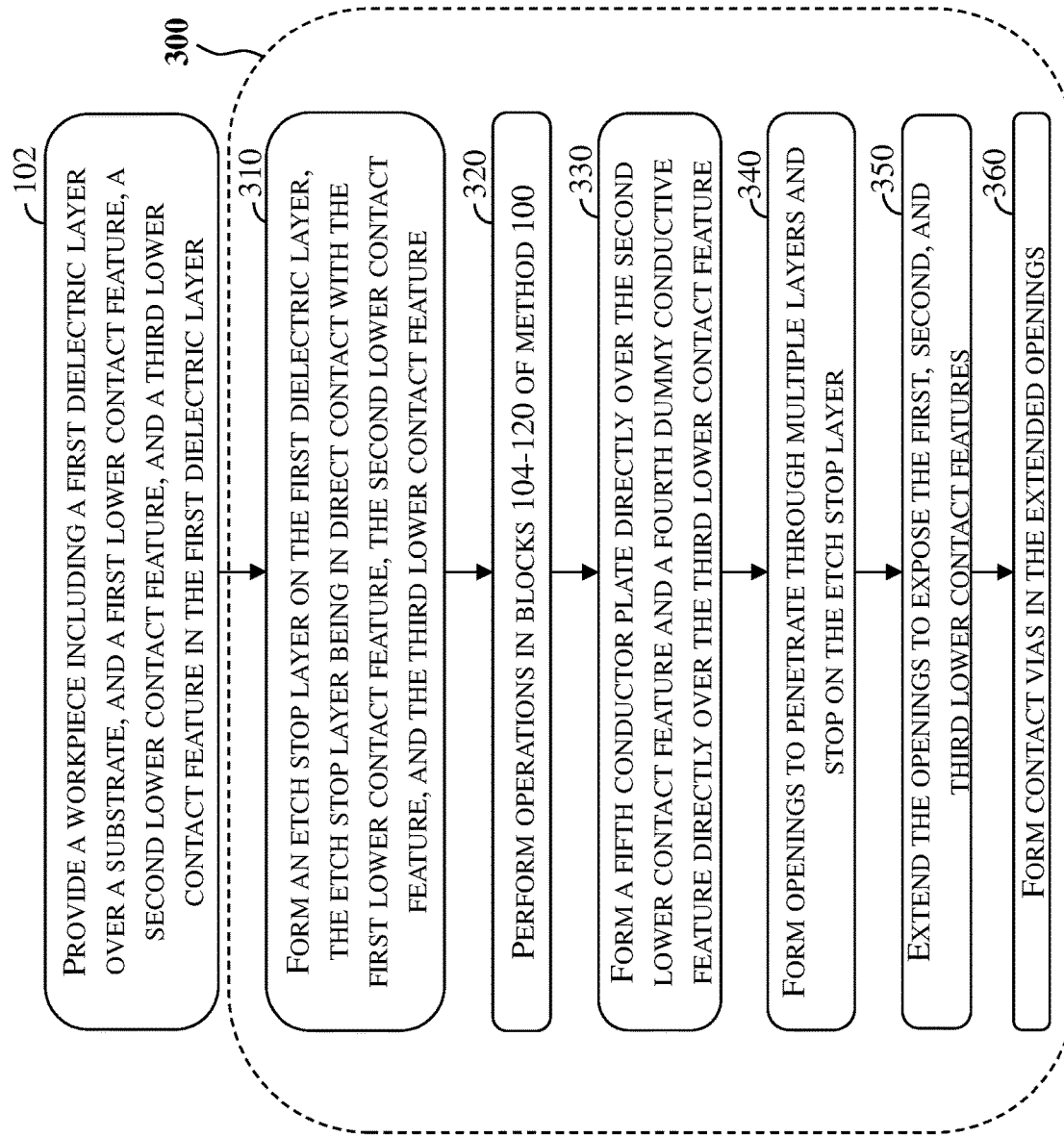
FIG. 22 is a flow chart of an alternative method for fabricating a device structure, according to various aspects of the present disclosure.

The various aspects of the present disclosure will now be described in more detail with reference to the figures. In that regard, FIG. 1 is a flowchart illustrating a method 100 for fabricating a device structure, according to embodiments of the present disclosure. Method 100 is described below in conjunction with FIGS. 2-21. FIGS. 2-16 and 18 are fragmentary cross-sectional views of a workpiece at different stages of fabrication according to embodiments of method 100, and each of FIGS. 17 and 19-21 shows a schematic illustration of a workpiece, according to embodiments of method 100. FIG. 22 is a flowchart illustrating a method 300 for fabricating a device structure, according to embodiments of the present disclosure. Method 300 is described below in conjunction with FIGS. 23-29, which are fragmentary cross-sectional views of a workpiece at different stages of fabrication according to embodiments of method 300. Because the workpiece (e.g., workpiece 200, workpiece 400) will be fabricated into a device structure at the conclusion of the fabrication processes, the workpiece may also be referred to as a device structure (e.g., device structure 200, device structure 400) as the context requires. Method 100 and method 300 are merely examples and are not intended to limit the present disclosure to what is explicitly illustrated therein. Additional steps can be provided before, during, and after method 100/300, and some steps described can be replaced, eliminated, or moved around for additional embodiments of the method. Not all steps are described herein in detail for reasons of simplicity. Additionally, throughout the present application, like reference numerals denote like features, unless otherwise excepted.

Figure 2:
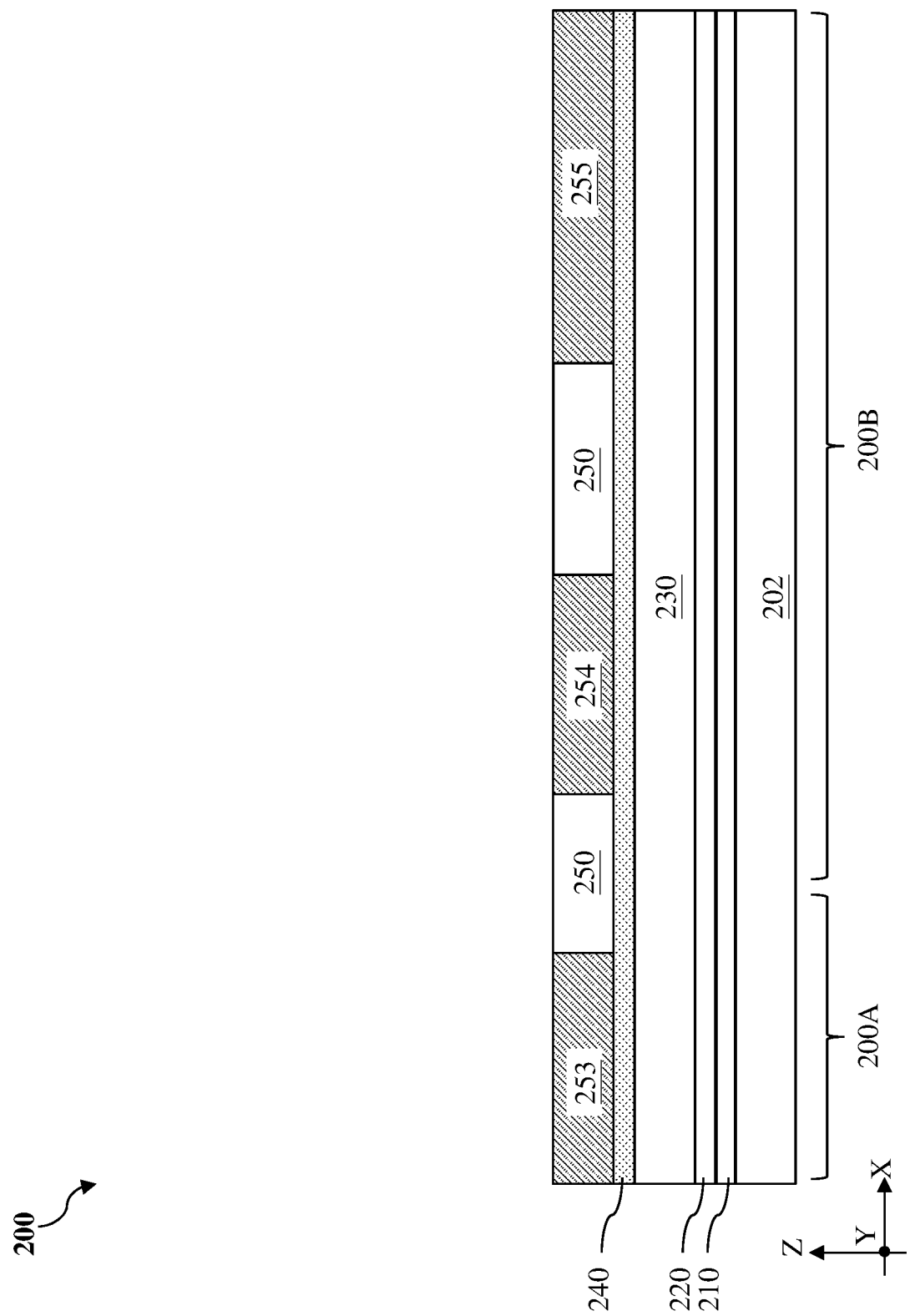
FIGS. 2, 3, 4, 5, 6, 7, 8, 9, 10, 11, 12, 13, 14, 15, 16 and 18 are fragmentary cross-sectional views of a workpiece during various fabrication stages in the method of FIG. 1, according to various aspects of the present disclosure.
Figure 3:
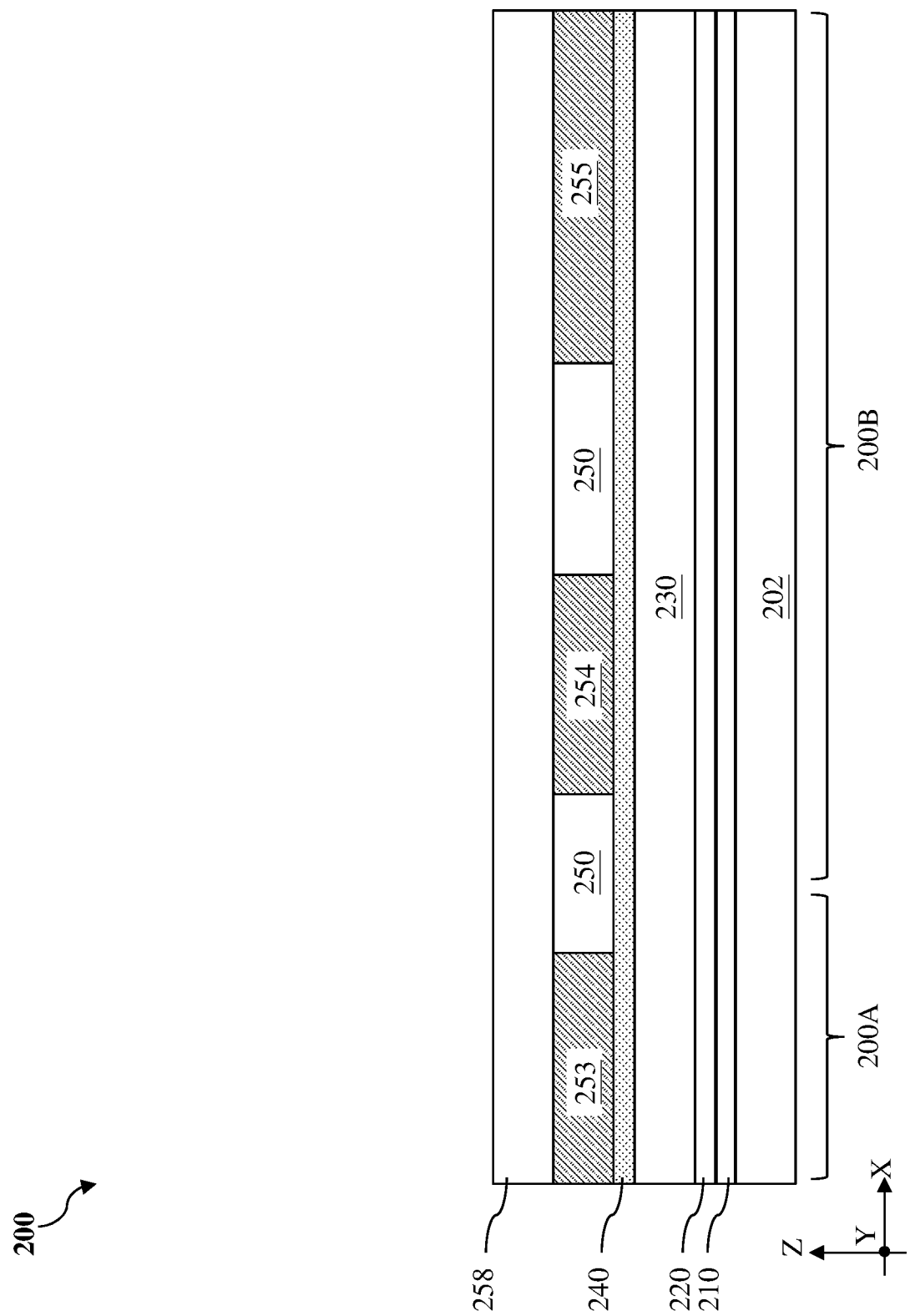

Referring to FIGS. 1 and 2, method 100 includes a block 102 where a workpiece 200 is provided. The workpiece 200 includes various layers already formed thereon. The workpiece 200 includes a substrate 202, which may be made of silicon or other semiconductor materials such as germanium. The substrate 202 also may include a compound semiconductor such as silicon carbide, gallium arsenic, indium arsenide, or indium phosphide. In some embodiments, the substrate 202 may include alloy semiconductor such as silicon germanium, silicon germanium carbide, gallium arsenic phosphide, or gallium indium phosphide. In some embodiments, the substrate 202 may include an epitaxial layer, such as an epitaxial layer overlying a bulk semiconductor. Various microelectronic components may be formed in or on the substrate 202, such as transistor components including source/drain features, gate structures, gate spacers, source/drain contacts, gate contacts, isolation structures including shallow trench isolation (STI), or any other suitable components. Source/drain feature (s) may refer to a source or a drain, individually or collectively dependent upon the context. Transistors formed on the substrate 202 may be planar devices or multi-gate devices. Multi-gate devices include, for example, fin-like field effect transistors (FinFETs) or multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

The workpiece 200 also includes a multi-layered interconnect (MLI) structure 210, which provides interconnections (e.g., wiring) between the various microelectronic components of the workpiece 200. The MLI structure 210 may also be referred to as an interconnect structure 210. The MLI structure 210 may include multiple metal layers or metallization layers. In some instances, the MLI structure 210 may include eight (8) to fourteen (14) metal layers. Each of the metal layers includes multiple conductive components embedded in an intermetal dielectric (IMD) layer. The conductive components may include contacts, vias, or metal lines. The IMD layer may be a silicon oxide or silicon-oxide-containing material where silicon exists in various suitable forms. As an example, the IMD layer includes silicon oxide or a low-k dielectric material having k-value (dielectric constant) smaller than that of silicon oxide, which is about 3.9. In some embodiments, the low-k dielectric material includes tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, combinations thereof, or other suitable materials.

In an embodiment, a carbide layer 220 is deposited on the MLI structure 210. The deposition process includes chemical vapor deposition (CVD), physical vapor deposition (PVD), atomic layer deposition (ALD), or combinations thereof. Any suitable type of carbide material such as silicon carbide (SiC) can be used in the carbide layer 220.

In an embodiment, an oxide layer 230 is deposited on the carbide layer 220. Any suitable deposition process for the oxide layer 230 may be used, including CVD, flowable CVD (FCVD), spin-on coating, PVD, ALD, or combinations thereof. In some embodiments, the oxide layer 230 includes undoped silicon oxide.

In an embodiment, a first etch stop layer (ESL) 240 is deposited on the oxide layer 230. The first ESL 240 may include silicon carbonitride (SiCN), silicon oxycarbide (SiOC), silicon carbide (SiC), silicon oxycarbonitride (SiOCN), or silicon nitride (SiN), or combinations thereof and may be formed by chemical vapor deposition (CVD), physical vapor deposition (PVD), atomic layer deposition (ALD), or combinations thereof.

The workpiece 200 also includes a first dielectric layer 250 deposited on the first ESL 240. A composition of the first dielectric layer 250 may be similar to that of the oxide layer 230. In some embodiments, the first dielectric layer 250 includes undoped silica glass (USG) or silicon oxide. The first dielectric layer 250 may be deposited using CVD, flowable CVD (FCVD), spin-on coating, PVD, ALD, or combinations thereof.

The workpiece 200 also includes a number of lower contact features (e.g., a lower contact feature 253, a lower contact feature 254, and a lower contact feature 255) formed in the first dielectric layer 250. The formation of the lower contact features may include patterning of the first dielectric layer 250 to form trenches and deposition of a barrier layer (not separately labeled) and a metal fill layer (not separately labeled) in the trenches. In some embodiments, the barrier layer may include titanium nitride or tantalum nitride and may be conformally deposited using PVD, CVD, metalorganic CVD (MOCVD), or a suitable method. In one embodiment, the barrier layer may include tantalum nitride. The metal fill layer may include copper (Cu) and may be deposited using electroplating or electroless plating. After the barrier layer and the metal fill layer are deposited, a planarization process, such as a chemical mechanical planarization (CMP) process, may be performed to remove excess barrier layer and metal fill layer to form the lower contact features 253, 254 and 255. Although the lower contact features 253, 254, and 255 are disposed below upper contact features (such as upper contact features 296, 297, 298 shown in FIG. 18), the lower contact features 253, 254, and 255 are sometimes referred to as top metal (TM) contacts.

In the present embodiments, the workpiece 200 includes a first region 200A and a second region 200B. In some embodiments, the first region 200A is a memory region, and the second region 200B may be a logic region. In the present embodiments, an MIM capacitor would be formed in the second region 200B. The lower contact feature 253 is in the first region 200A, and the lower contact features 254 and 255 are in the second region 200B. In embodiments represented in FIG. 3, after forming the lower contact features 253, 254, and 255, a first passivation structure 258 is formed on the workpiece 200 and in direct contact with the lower contact features 253, 254, and 255. In an embodiment, the first passivation structure 258 includes a dielectric layer that is formed by an oxide material, such as undoped silica glass (USG), silicon oxide, or other suitable material(s).

Figure 4:
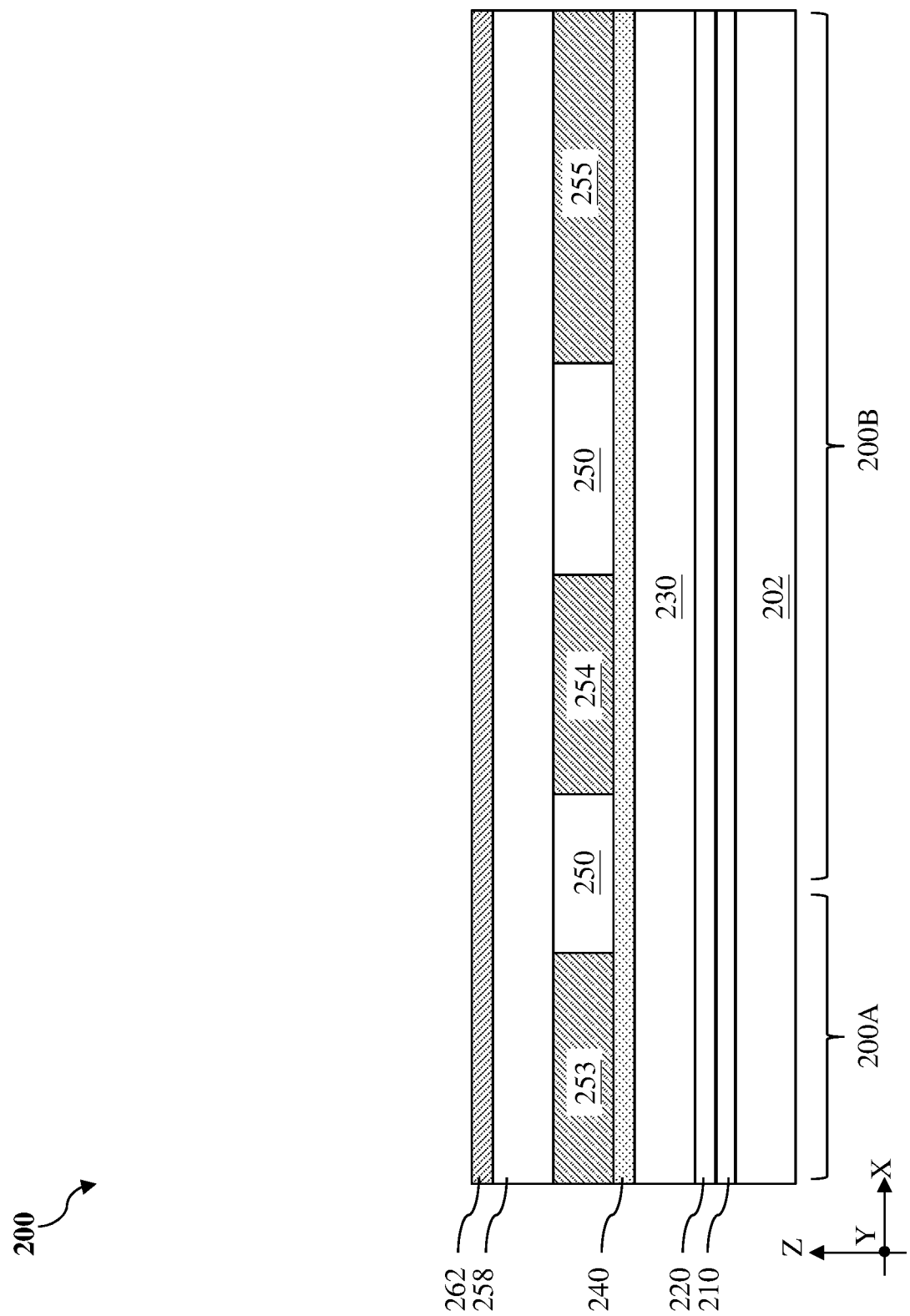

Referring to FIGS. 1 and 4, method 100 includes a block 104 where a first conductive layer 262 is formed directly on the first passivation structure 258. The first conductive layer 262 may be deposited on the first passivation structure 258 using PVD, CVD, or MOCVD. In some embodiments, the first conductive layer 262 may include titanium (Ti), tantalum (Ta), titanium nitride (TiN), tantalum nitride (TaN), copper (Cu), cobalt (Co), nickel (Ni), tungsten (W), aluminum (Al), or other suitable materials. The first conductive layer 262 may cover an entire top surface of the workpiece 200.

Figure 5:
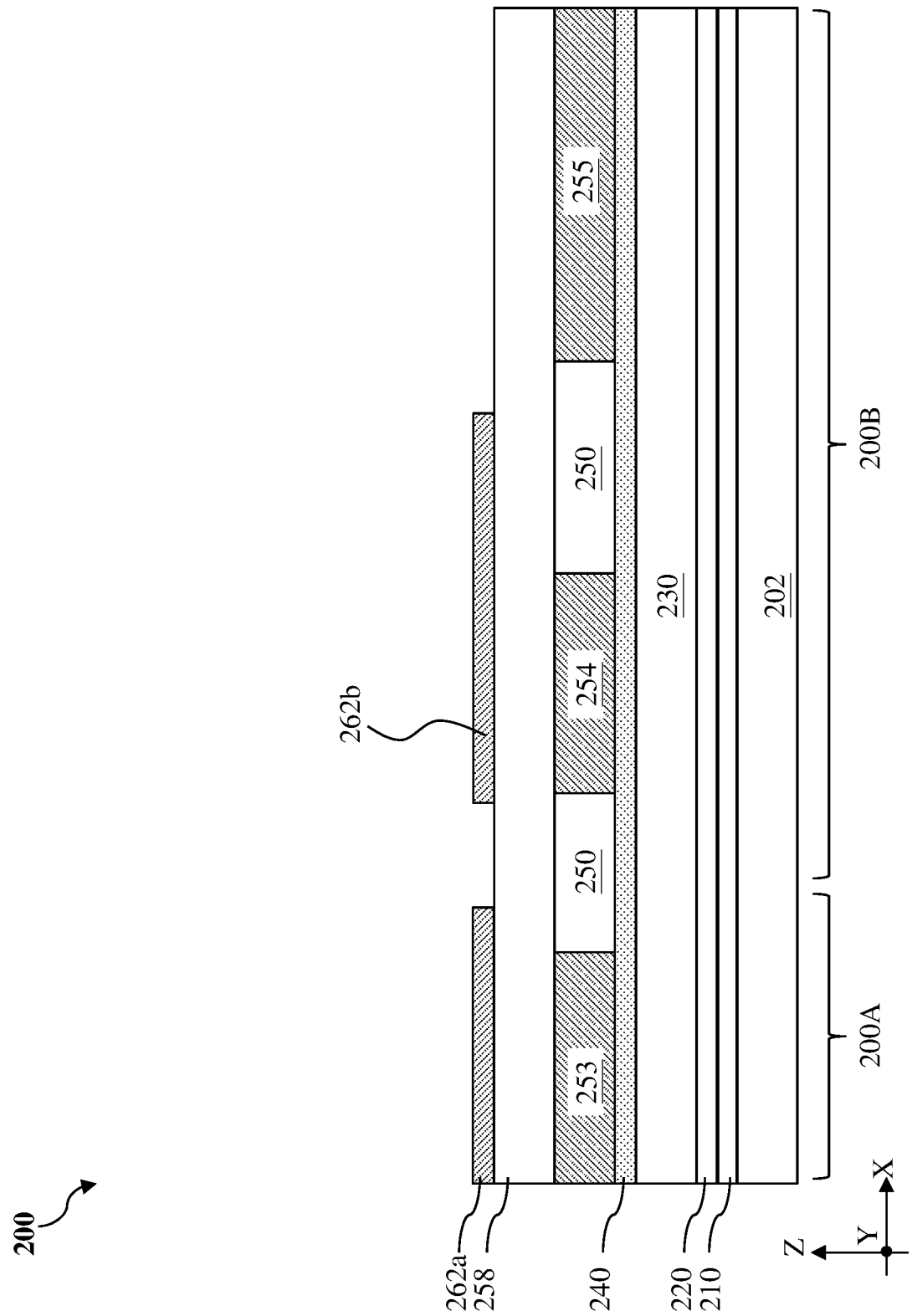

Referring to FIGS. 1 and 5, method 100 includes a block 106 where the first conductive layer 262 is patterned to form a first dummy conductive feature 262a directly over the lower contact feature 253 in the first region 200A and a first conductor plate 262b directly over the lower contact feature 254 in the second region 200B. The patterning may include deposition of a hard mask layer over the first conductive layer 262, formation of a photoresist layer over the hard mask layer, patterning of the photoresist layer using photolithography, etching of the hard mask layer using the patterned photoresist layer as an etch mask, and then etching of the first conductive layer 262 using the patterned hard mask as an etch mask. Since the first dummy conductive feature 262a and the first conductor plate 262b are formed by patterning the first conductive layer 262, the first dummy conductive feature 262a and the first conductor plate 262b are formed simultaneously and are formed of the same composition.

Figure 6:
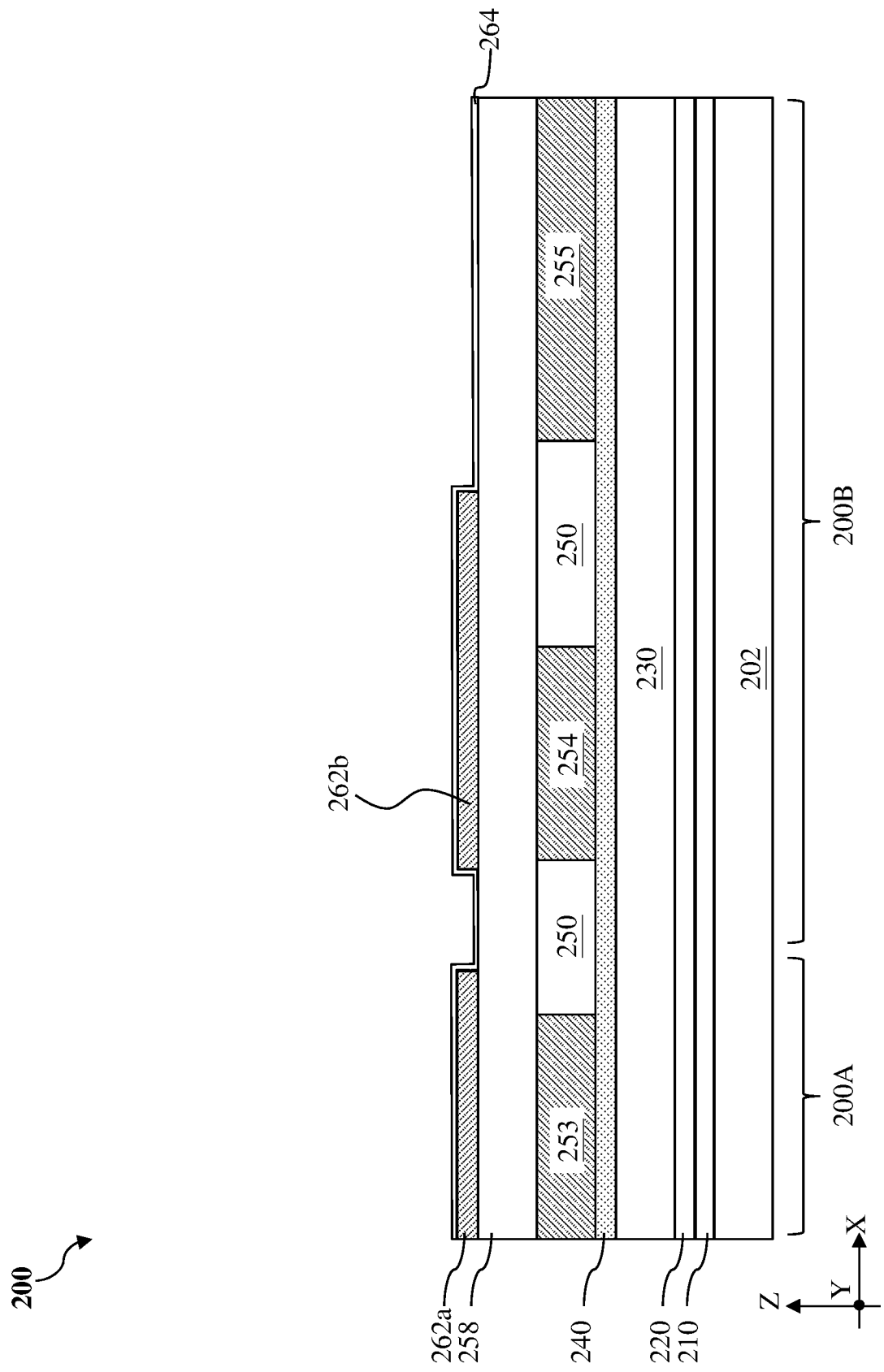

Referring to FIGS. 1 and 6, method 100 includes a block 108 where a first insulator layer 264 is deposited over the workpiece 200. As shown in FIG. 6, after the first conductive layer 262 is patterned to form the first dummy conductive feature 262a and the first conductor plate 262b, the first insulator layer 264 is deposited. In an embodiment, the first insulator layer 264 is conformally deposited to have a generally uniform thickness over the top surface of the workpiece 200 (e.g., having about the same thickness on top and sidewall surfaces of the first conductor plate 262b). The first insulator layer 264 may be deposited using CVD, ALD, or a suitable deposition method and may be a high-k dielectric layer that includes hafnium oxide, aluminum oxide, zirconium oxide, titanium oxide, tantalum oxide, or a combination thereof.

Figure 7:
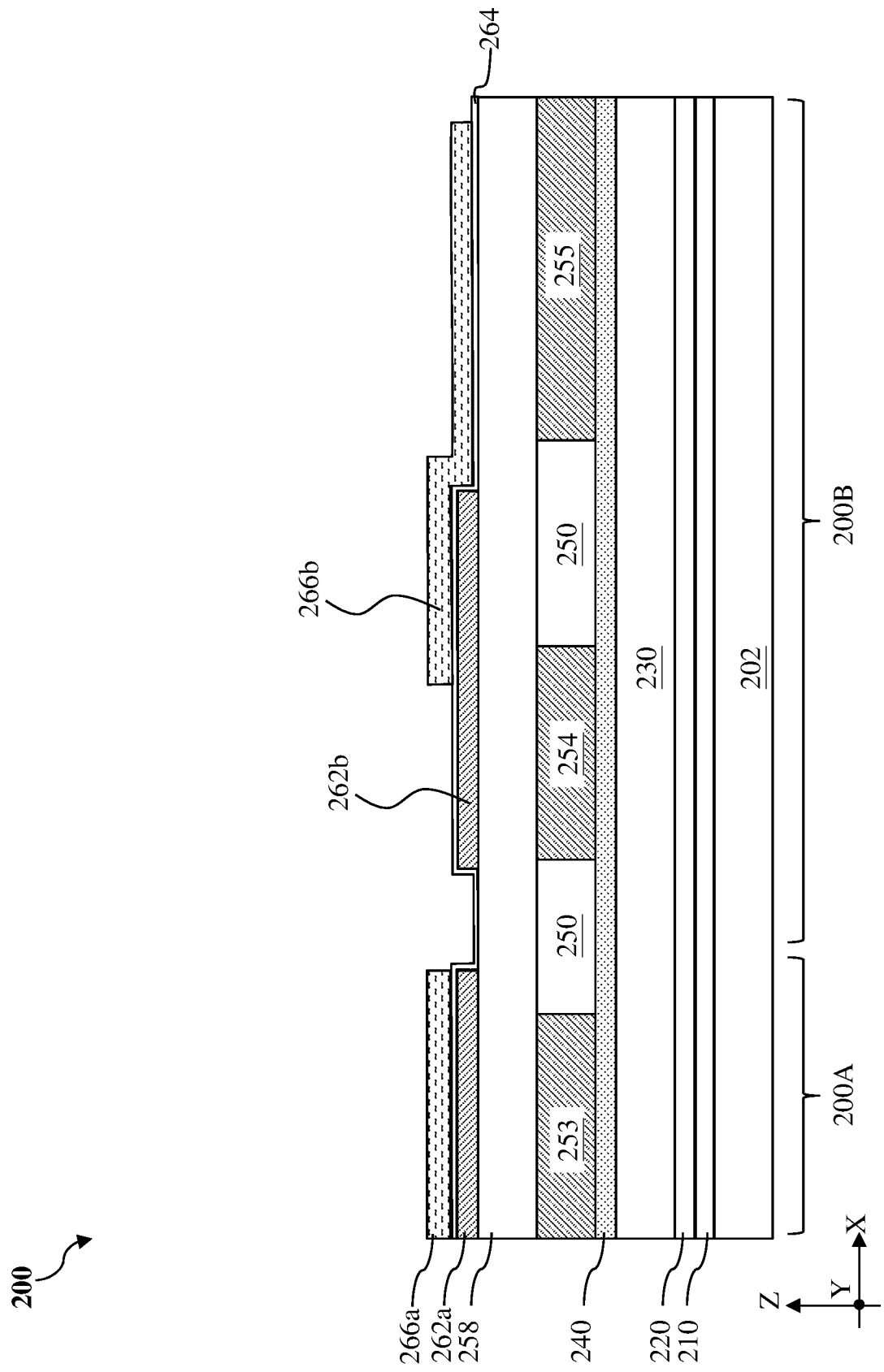

Referring to FIGS. 1 and 7, method 100 includes a block 110 where a second dummy conductive feature 266a and a second conductor plate 266b are formed on the first insulator layer 264. More specifically, the second dummy conductive feature 266a is formed directly over the lower contact feature 253 in the first region 200A and the second conductor plate 266b is formed directly over the lower contact feature 255 in the second region 200B. The second conductor plate 266b is vertically overlapped with the first conductor plate 262b. The formation of the second conductor plate 266b and the second dummy conductive feature 266a may be in a way similar to the formation of the first conductor plate 262b and the first dummy conductive feature 262a, respectively. For example, a second conductive layer may be deposited over the workpiece 200 and then patterned to form the second conductor plate 266b in the second region 200B and the second dummy conductive feature 266a in the first region 200A.

Figure 8:
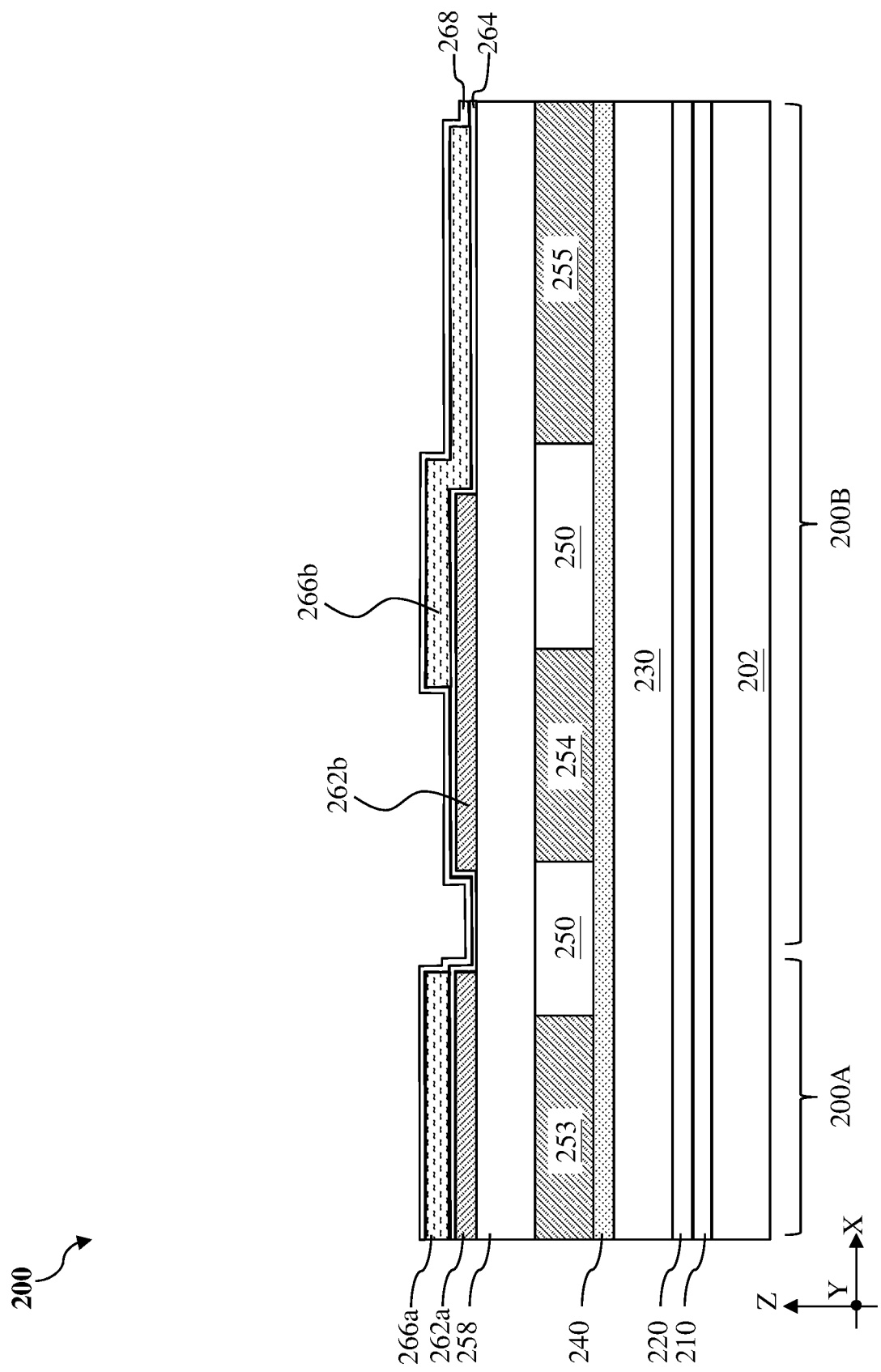

Referring to FIGS. 1 and 8, method 100 includes a block 112 where a second insulator layer 268 is formed over the workpiece 200. In an embodiment, the second insulator layer 268 is conformally deposited to have a generally uniform thickness over the top surface of the workpiece 200 (e.g., having about the same thickness on top and sidewall surfaces of the second conductor plate 266). The formation and composition of the second insulator layer 268 may be in a way similar to those of the first insulator layer 264 and repeated description is omitted for reason of simplicity.

Figure 9:
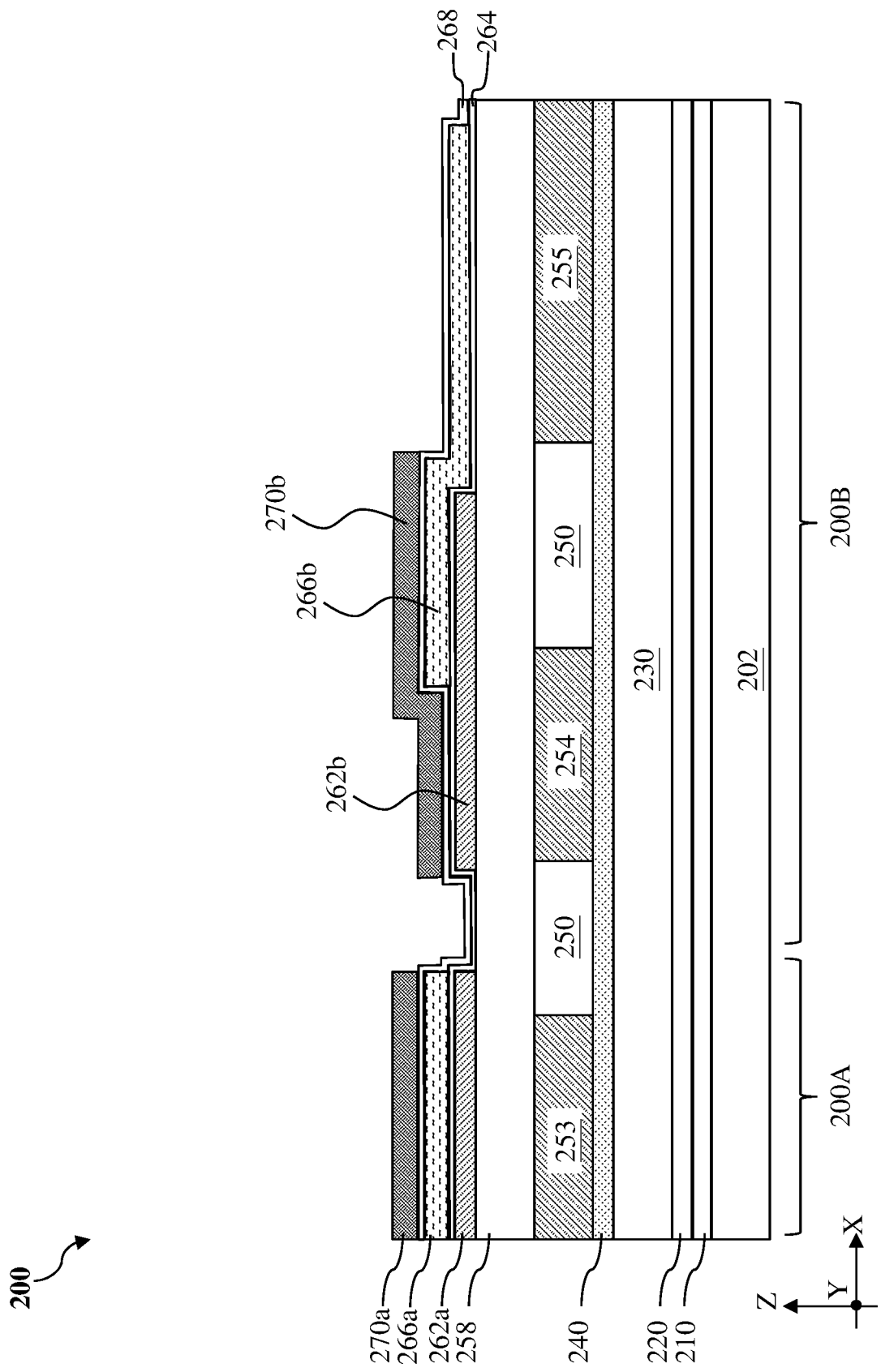

Referring to FIGS. 1 and 9, method 100 includes a block 114 where a third dummy conductive feature 270a and a third conductor plate 270b are formed on the second insulator layer 268. More specifically, the third dummy conductive feature 270a is formed directly over the second dummy conductive feature 266a and the lower contact feature 253 in the first region 200A, and the third conductor plate 270b is formed directly over the lower contact feature 254 in the second region 200B. The third conductor plate 270b is vertically overlapped with both the first conductor plate 262b and the second conductor plate 266b. The formation and composition of the third dummy conductive feature 270a and the third conductor plate 270b may be in a way similar to those of the first dummy conductive feature 262a and the first conductor plate 262b, respectively, and repeated description is omitted for reason of simplicity.

Figure 10:
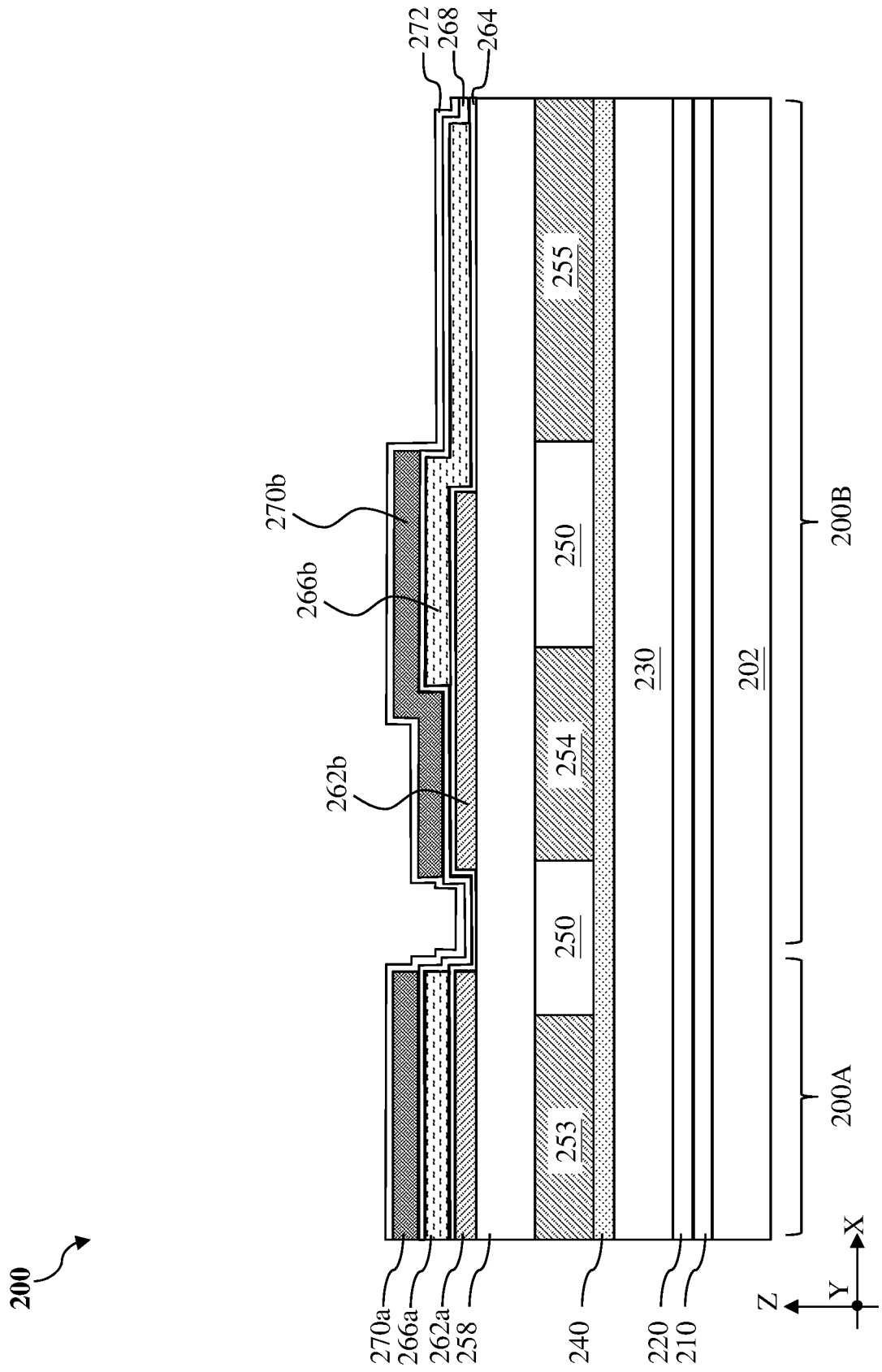

Referring to FIGS. 1 and 10, method 100 includes a block 116 where a third insulator layer 272 is formed over the workpiece 200. In an embodiment, the formation and composition of the third insulator layer 272 is in a way similar to those of the first insulator layer 264 and repeated description is omitted for reason of simplicity.

Figure 11:
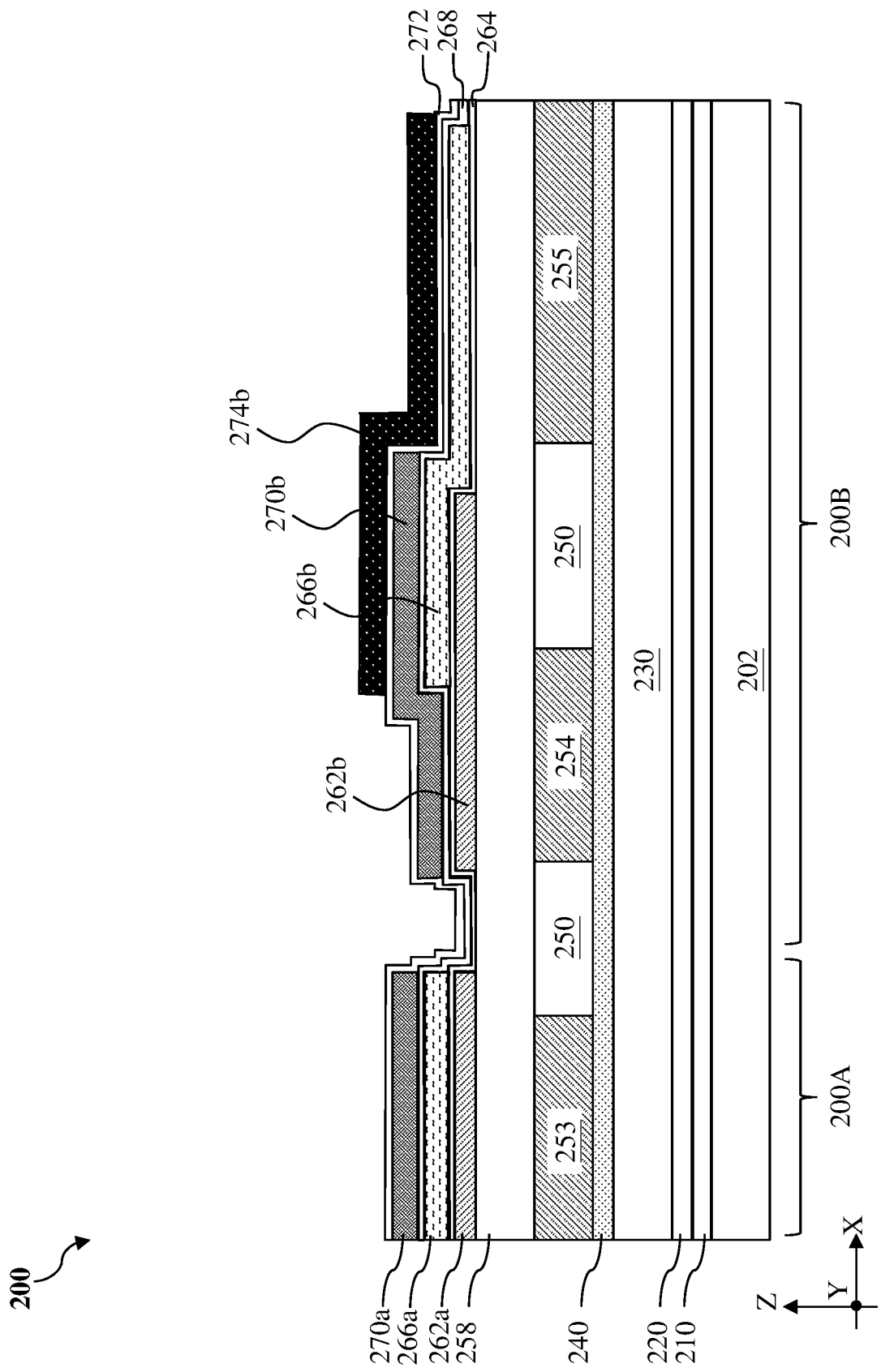

Referring to FIGS. 1 and 11, method 100 includes a block 118 where a fourth conductor plate 274b is directly formed on the third insulator layer 272. In the present embodiments, the fourth conductor plate 274b is formed directly over the lower contact feature 255 and vertically overlapped with the third conductor plate 270b. The formation and composition of the fourth conductor plate 274b may be in a way similar to those of the first conductor plate 262b. For example, a conductive layer may be deposited on the third insulator layer 272 and then be patterned to form the fourth conductor plate 274b.

Figure 12:
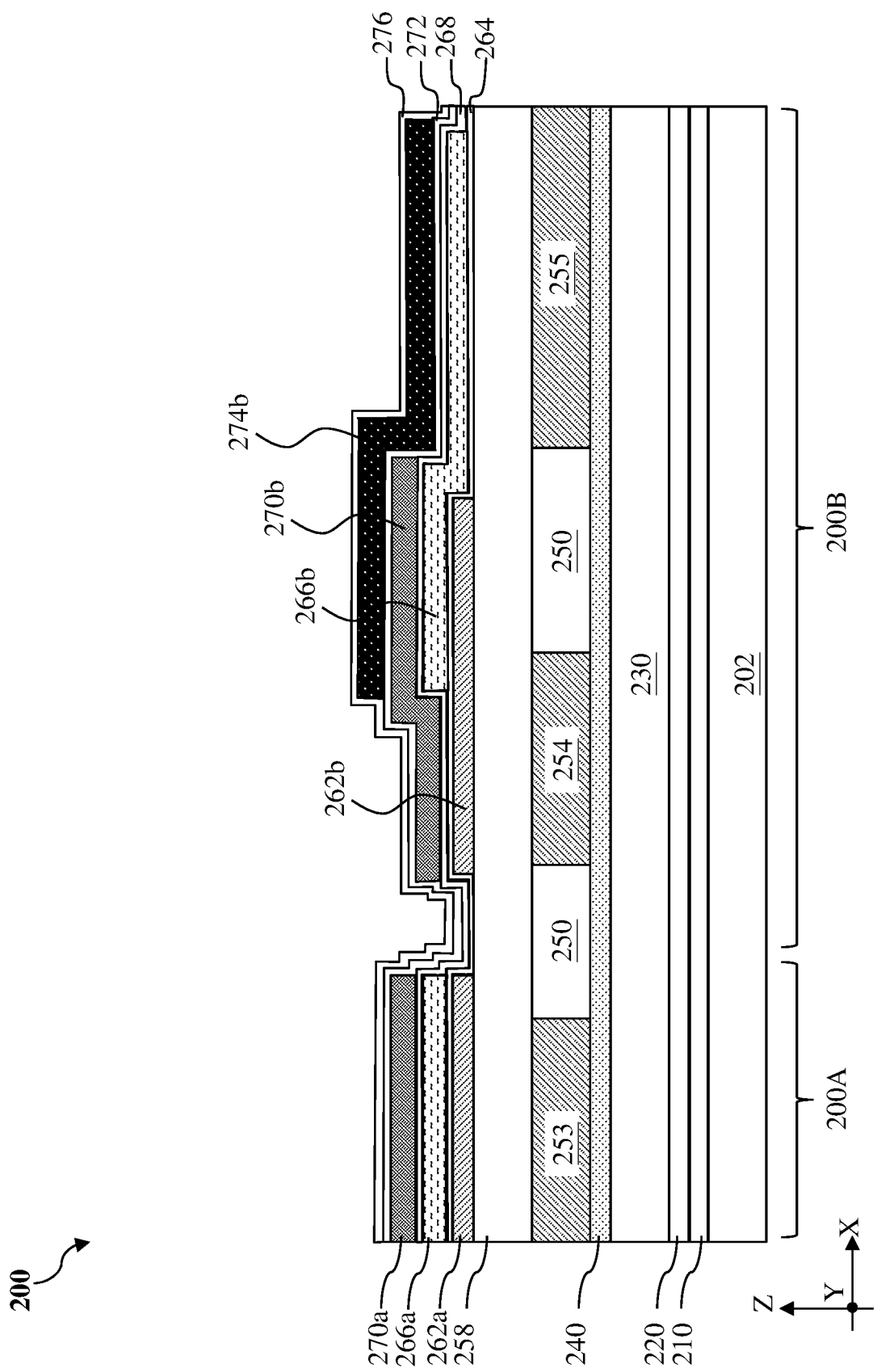

Referring to FIGS. 1 and 12, method 100 includes a block 120 where a fourth insulator layer 276 is formed over the workpiece 200. In an embodiment, the formation and composition of the fourth insulator layer 276 is in a way similar to those of the first insulator layer 264.

Figure 13:
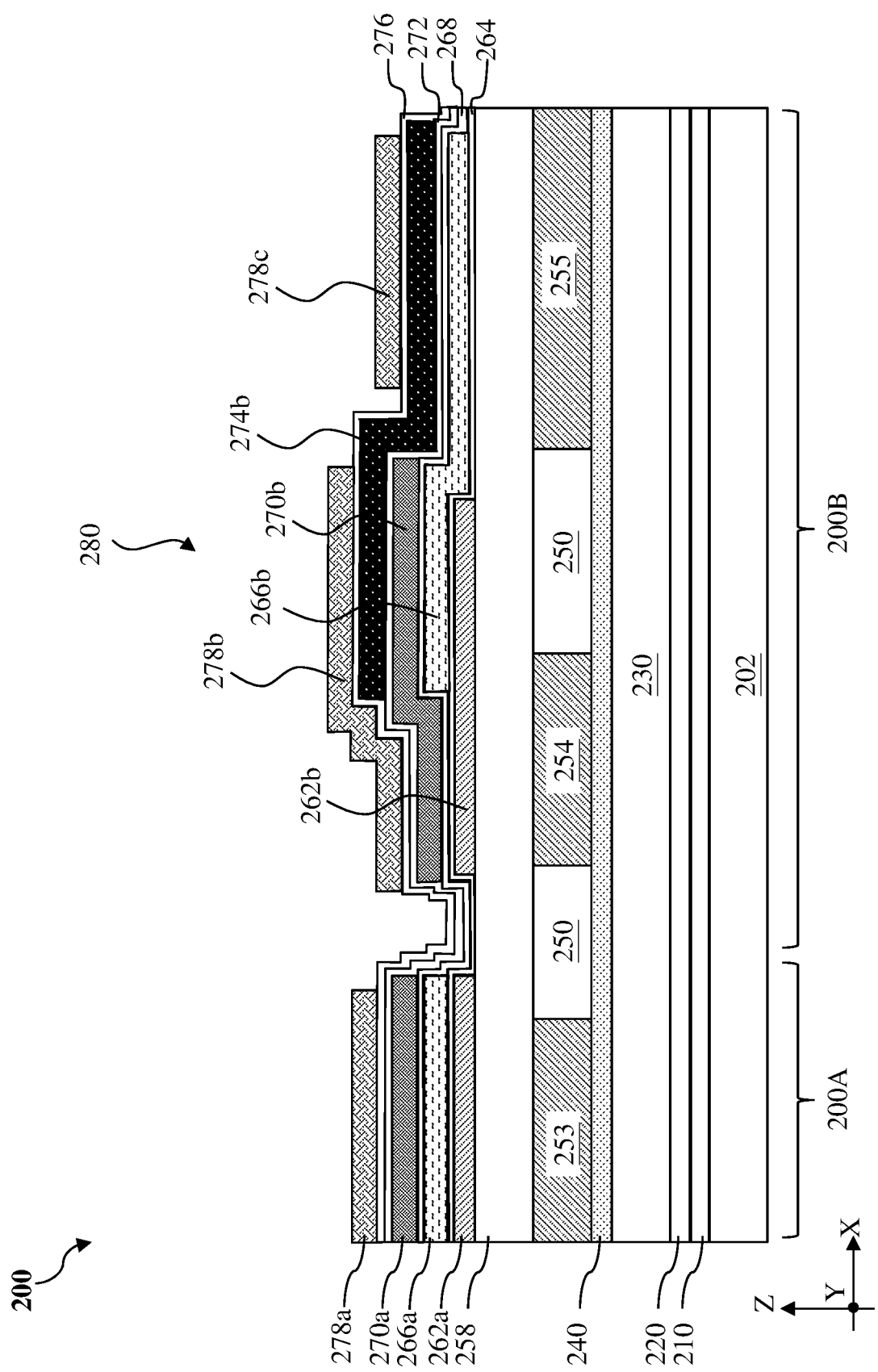

Referring to FIGS. 1 and 13, method 100 includes a block 122 where a fifth conductor plate 278b, a fourth dummy conductive feature 278a, and a fifth dummy conductive feature 278c are formed on the fourth insulator layer 276. More specifically, in embodiments represented in FIG. 13, the fifth conductor plate 278b is formed directly over the lower contact feature 254 and is vertically overlapped with the first, second, third, and fourth conductor plate 262b, 266b, 270b, and 274b. The fourth dummy conductive feature 278a is formed directly over the third dummy conductive feature 270a and the lower contact feature 253 in the first region 200A. The fifth dummy conductive feature 278c is formed directly over the fourth conductor plate 274b and the lower contact feature 255. The formation of the fifth conductor plate 278b, a fourth dummy conductive feature 278a, and a fifth dummy conductive feature 278c may include depositing a conducive layer on the fourth insulator layer 276 and patterning the conducive layer to form the fifth conductor plate 278b, a fourth dummy conductive feature 278a, and a fifth dummy conductive feature 278c. The composition of this conducive layer may be in a way similar to that of the first conductive layer 262.

After the formation of the fifth conductor plate 278b, the structure of a MIM capacitor 280 is finalized. In embodiments represented in FIG. 13, the workpiece 200 includes the first, second, third, and fourth dummy conductive features 262a, 266a, 270a, and 278a formed directly over the lower contact feature 253 in the first region 200A, the MIM capacitor 280 formed in the second region 200B, and the fifth dummy conductive feature 278c formed in the second region 200B. In the present embodiments, the MIM capacitor 280 includes five vertically stacked conductor plates (i.e., the first conductor plate 262b, the second conductor plate 266, and the third conductor plate 270b, the fourth conductor plate 274b, and the fifth conductor plate 278b) and multiple insulator layers (i.e., the first insulator layer 264, the second insulator layer 268, the third insulator layer 272, and the fourth insulator layer 276). The dummy conductive features and the conductor plates may be referred to as conductive features. In the represent embodiments, the number of conductive features formed directly over the lower contact feature 254 is equal to the number of conductive features formed directly over the lower contact feature 255. Also, the number of conductive features formed directly over the lower contact feature 253 is greater than the number of conductive features formed directly over the lower contact feature 254.

Figure 14:
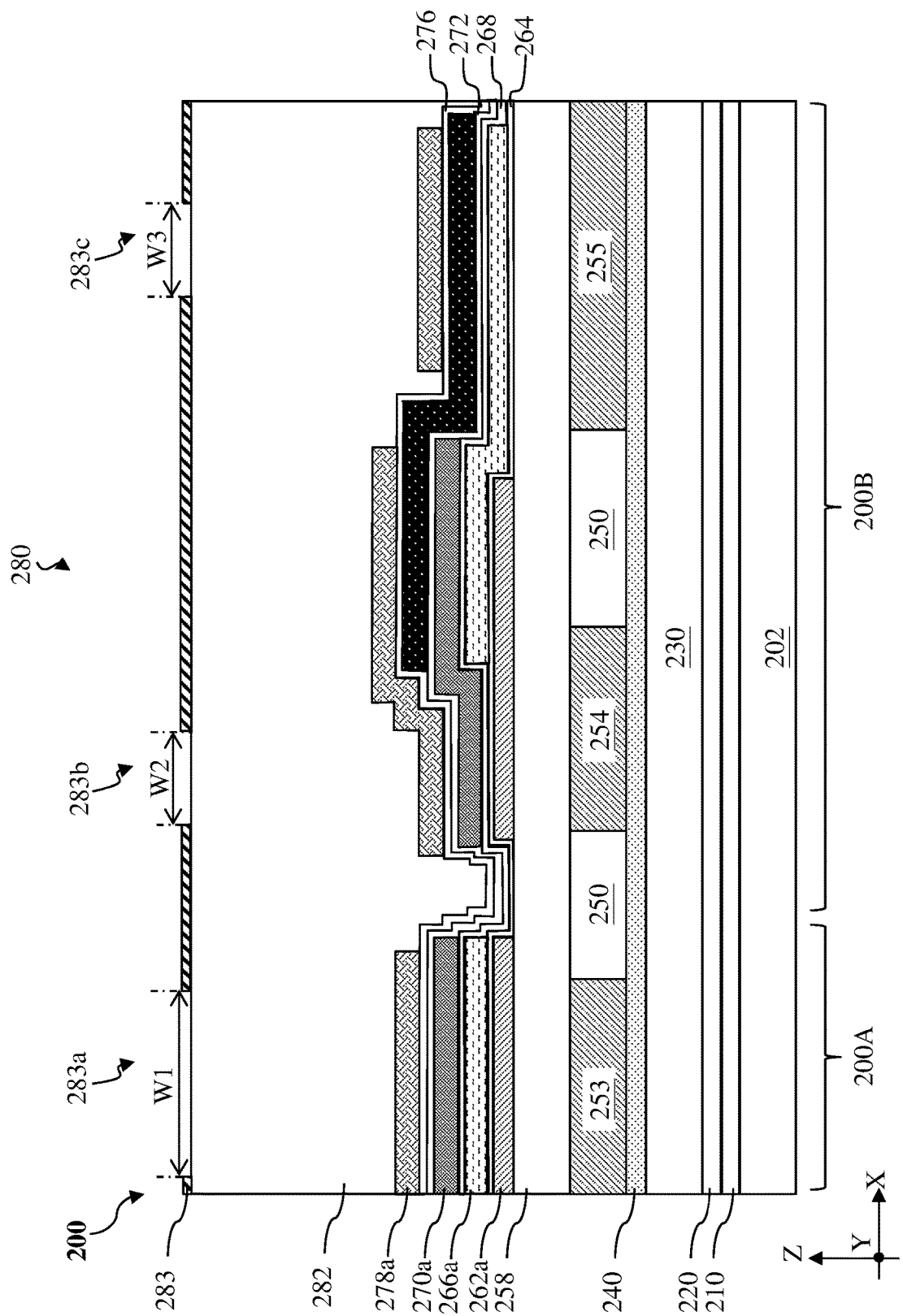
Figure 15:
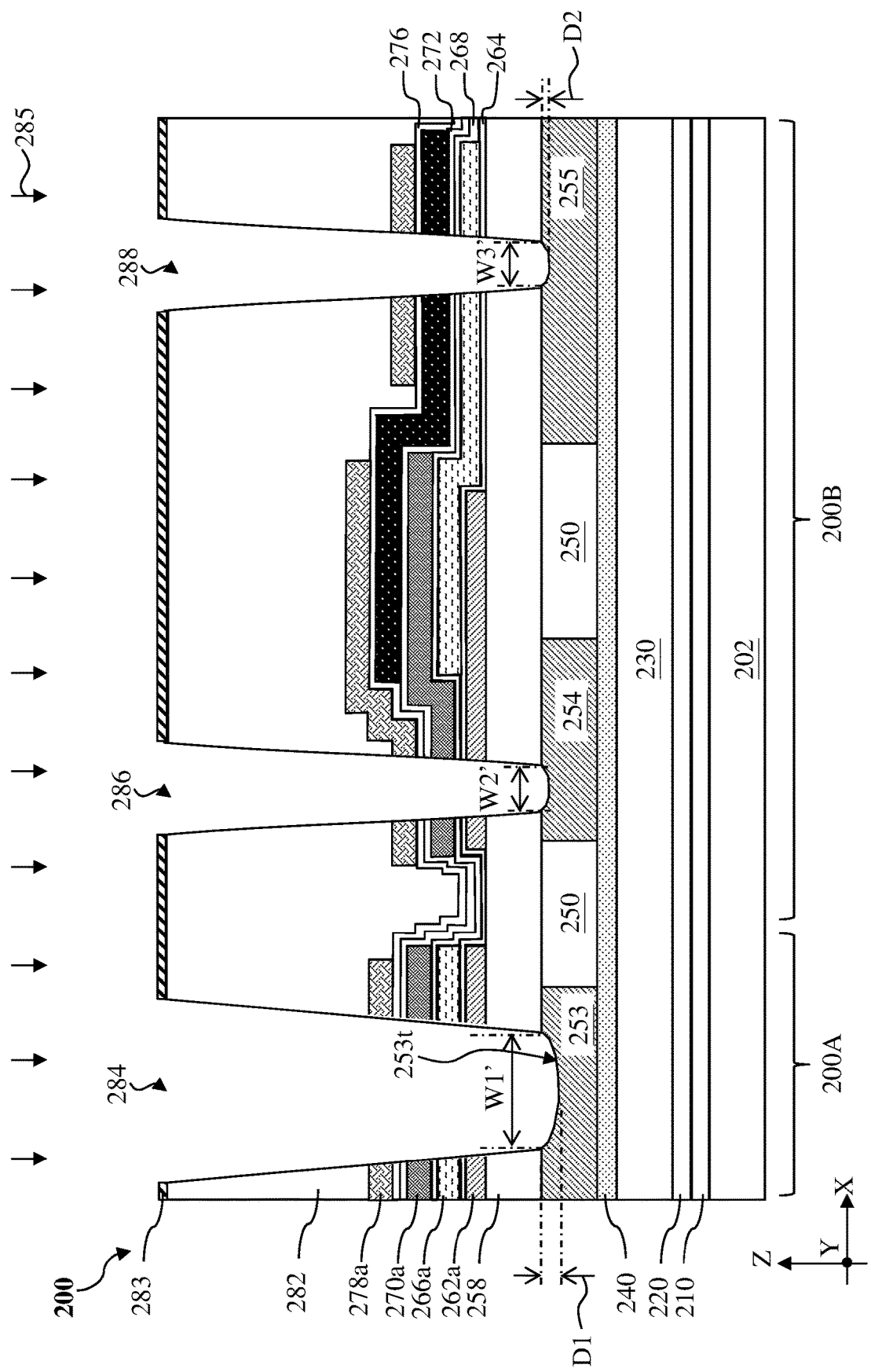

Referring to FIGS. 1, 14, and 15, method 100 includes a block 124 where a first opening 284, a second opening 286, and a third opening 288 are formed. In embodiments represented in FIG. 14, a second passivation structure 282 is formed over the MIM capacitor 280. As shown in FIG. 14, the MIM capacitor 280 is sandwiched between the second passivation structure 282 and first passivation structure 258. In some embodiments, the second passivation structure 282 may include a dielectric layer or two or more dielectric layers formed by any suitable materials such as silicon oxide or silicon nitride.

After forming the second passivation structure 282, as shown in FIG. 14, a patterned mask film 283 is formed on the second passivation structure 282. The patterned mask film 283 includes three openings 283a, 283b, and 283c exposing portions of the second passivation structure 282 thereunder. For example, the opening 283a exposes a portion of the second passivation structure 282 formed directly over the lower contact feature 253 in the first region 200A, the opening 283b exposes a portion of the second passivation structure 282 formed directly over the lower contact feature 254 in the second region 200B, and the opening 283c exposes a portion of the second passivation structure 282 formed directly over the lower contact feature 255 in the second region 200B. In the present embodiments, the opening 283a spans a width W1, the opening 283b spans a width W2, and the opening 283c spans a width W3. The width W1 is greater than the width W2 and the width W3. In an embodiment, a ratio of the width W1 to the width W2 is greater than 1.5. In some embodiments, W1 may be greater than 10 um. In an embodiment, the width W2 is equal to the width W3.

While using the patterned mask film 283 as an etch mask, an etching process 285 may be performed to form a first opening 284, a second opening 286, and a third opening 288, as represented in FIG. 15. The depths of the first opening 284, the second opening 286, and the third opening 288 may depend on the duration of the etching process 285. In an embodiment, the etching process 285 etches through the second passivation structure 282, the fourth dummy conductive feature 278a, the fourth insulator layer 276, the third insulator layer 272, the third dummy conductive feature 270a, the second insulator layer 268, the second dummy conductive feature 266a, the first insulator layer 264, and the first dummy conductive feature 262a to expose the top surface of the lower contact feature 253 and form the first opening 284. The etching process 285 also etches through the second passivation structure 282, the fifth conductor plate 278b, the fourth insulator layer 276, the third insulator layer 272, the third conductor plate 270b, the second insulator layer 268, the first insulator layer 264, and the first conductor plate 262b to expose the top surface of the lower contact feature 254 and form the second opening 286. The etching process 285 further etches through the second passivation structure 282, the fifth dummy conductive feature 278c, the fourth insulator layer 276, the fourth conductor plate 274b, the third insulator layer 272, the second insulator layer 268, the second conductor plate 266b, and the first insulator layer 264 to expose the top surface of the lower contact feature 255 and form the third opening 288. By forming the fifth dummy conductive feature 278c directly over the lower contact feature 255, during the formation of the second opening 286 and the third opening 288, the etching process 285 etches through the same number of conductive features such that the depth of the second opening 286 may be substantially equal to the depth of the third opening 288.

In the present embodiments, since the width W1 is greater than the width W2 and the width W3, due to loading effect, the etching process 285 etches features over the lower contact feature 253 at an etch rate that is greater than it etches features over the lower contact feature 254 and features over the lower contact feature 255. In the present embodiments, there are four conductive features (e.g., the first, second, third, and fourth dummy conductive features 262a, 266a, 270a, 278a) directly over the lower contact feature 253, three conductive features (e.g., the fifth, third, and first conductor plates 278b, 270b, 262b) directly over the lower contact feature 254, and three conductive features (e.g., the fifth dummy conductive feature 278c, the fourth and the second conductor plates 274b and 266b) directly over the lower contact feature 255. That is, the number of conductive features over the lower contact feature 253 is greater than the number of conductive features over the lower contact feature 254. In the present embodiments, the first region 200A has one more conductive feature formed over the lower contact feature 253 than that of the conductive features formed over the lower contact feature 254/255 in the second region 200B. The etching process 285 may etch conductive feature at an etch rate slower than it etches dielectric layers. As such, even though the etch rates are different in forming the first opening 284 in the first region 200A and the second and third openings 286 and 288 in the second region 200B, within a predetermined duration, by providing that one more conductive feature in the first region 200A, the extent at which the lower contact feature 253 in the first region 200A would be etched during the etching process 285 may be advantageously reduced, comparing to embodiments that doesn't include the extra conductive feature(s) in the first region 200A. In some embodiments, the over etch of the lower contact feature 253 in the first region 200A may be advantageously reduced, thereby reducing potential defects, and improving the reliability of the device structure.

In an embodiment, during the etching process 285, a top portion of the lower contact feature 253 that has a thickness D1 may be recessed, and a top portion of the lower contact feature 255 that has a thickness D2 may be recessed. The thickness D1 may be greater than the thickness D2. That is, the first opening 284 has a depth that is greater than a depth of the third opening 288. In some embodiments, the depth of the first opening 284 may be also greater than a depth of the second opening 286. In embodiments represented in FIG. 15, a portion of a top surface of the lower contact feature 253 ("a top surface 253t") exposed by the first opening 284 has a width W1', a portion of the top surface of the lower contact feature 254 exposed by the second opening 286 has a width W2', and a portion of the top surface of the lower contact feature 255 exposed by the third opening 288 has a width W3', the width W1' is greater than the width W2' and the width W3'. In some embodiments, the top surface 253t includes a concave surface that curves inward. After forming the first, second, and third openings 284, 286, and 288, the patterned mask film 283 may be selectively removed.

Figure 16:
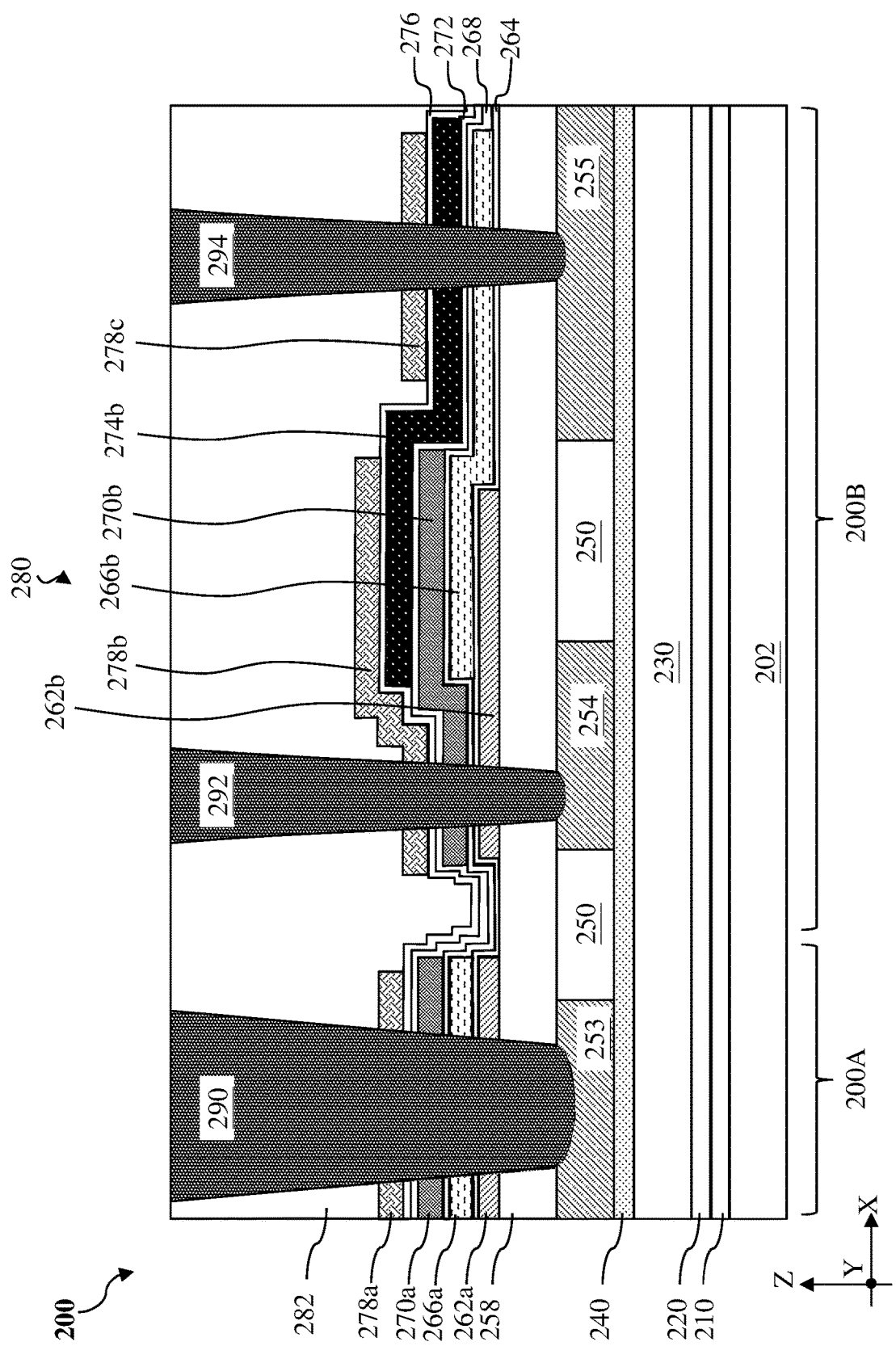

Referring to FIGS. 1 and 16, method 100 includes a block 126 where a contact via 290 is formed in the first opening 284, a contact via 292 is formed in the second opening 286, and a contact via 294 is formed in the third opening 288. In an embodiment, to form the contact vias 290, 292, and 294, a barrier layer (not separately labeled) may be first conformally deposited over the second passivation structure 282 and into the first, second, and third openings 284, 286 and 288 using a suitable deposition technique, such as ALD, PVD or CVD and then a metal fill layer (not separately labeled) is deposited over the barrier layer using ALD, PVD, CVD, electroless plating, or electroplating. The barrier layer may include titanium nitride (TiN), tantalum nitride (TaN), or another metal nitride. The metal fill layer may be formed of copper (Cu), aluminum (Al), or an alloy thereof. A planarization process (e.g., CMP process) may be then performed after forming the metal fill layer to define a final structure of the contact vias 290, 292, and 294. The contact via 290 tracks the shape of the first opening 284, the contact via 292 tracks the shape of the second opening 286, and the contact via 294 tracks the shape of the third opening 288. That is, a depth of the contact via 290 along the Z direction may be greater than a depth of the contact via 292 and a depth of the contact via 294.

Figure 17:
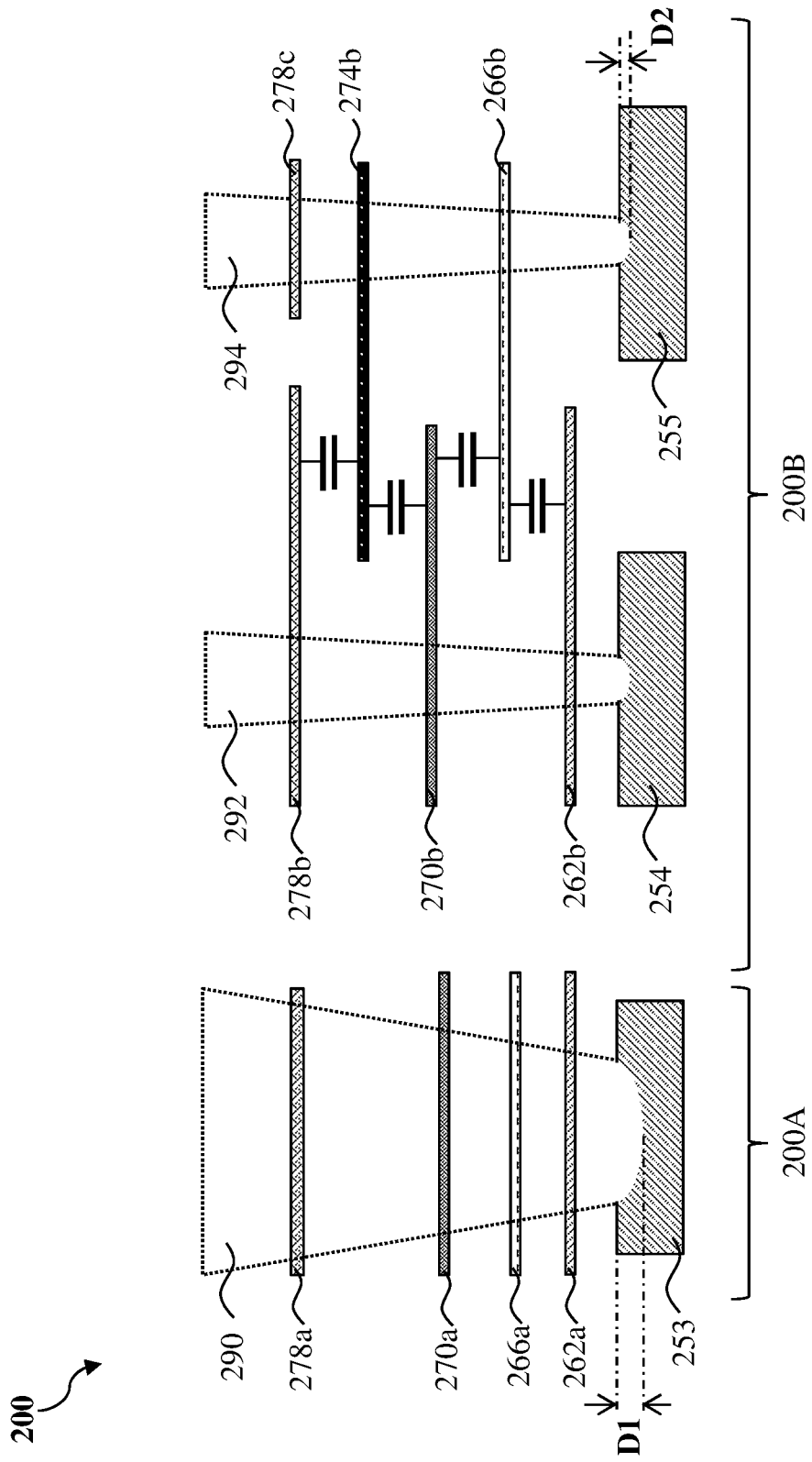
FIG. 17 is a schematic illustration of the device structure shown in FIG. 16, according to various aspects of the present disclosure.
Figure 18:
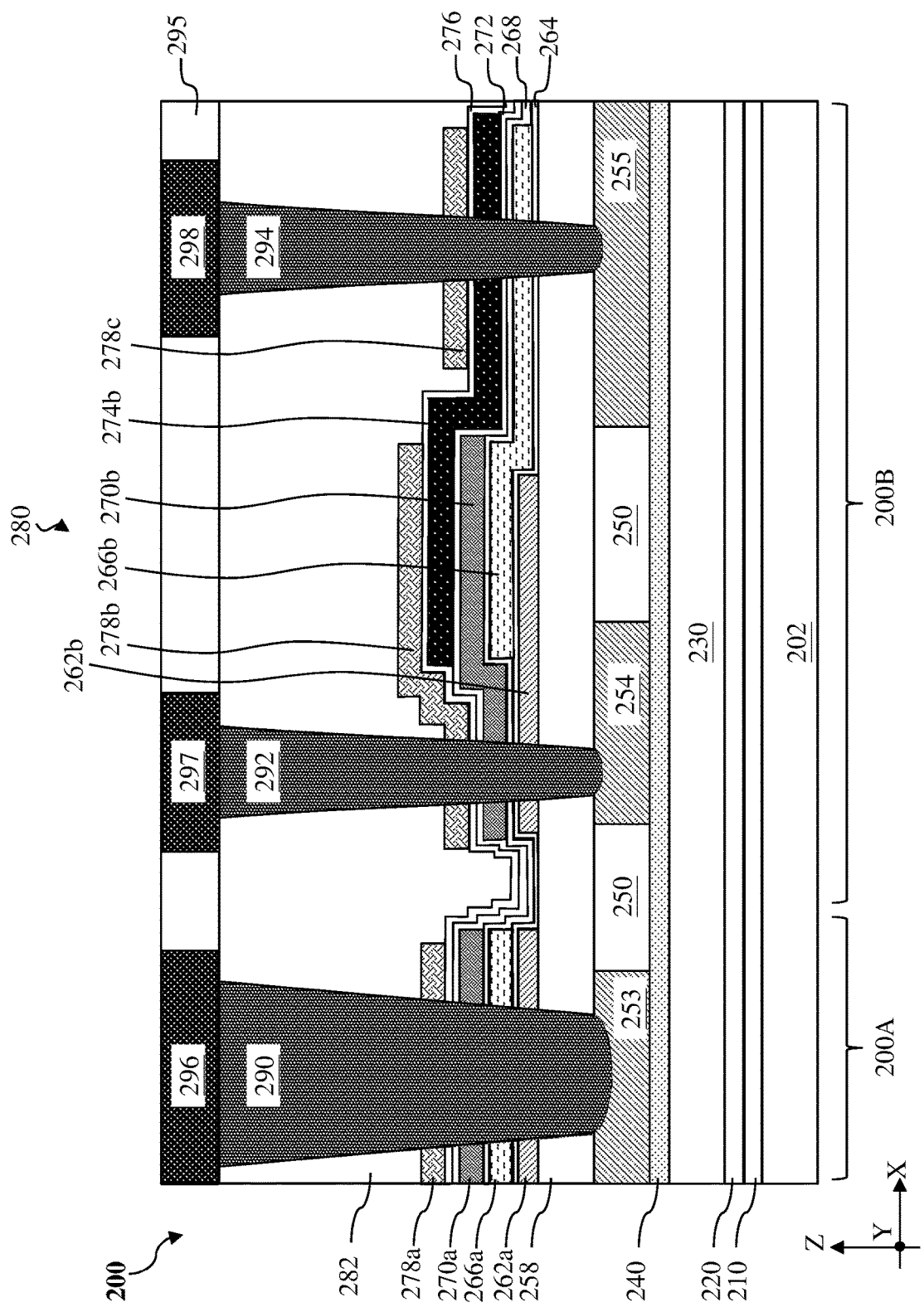

FIG. 17 is a schematic illustration of the device structure 200 shown in FIG. 16, according to various aspects of the present disclosure. In embodiments represented in FIGS. 16 and 17, the contact via 290 extends through the fourth dummy conductive feature 278a, the third dummy conductive feature 270a, the second dummy conductive feature 266a, and the first dummy conductive feature 262a, and in direct contact with the lower contact feature 253. That is, the contact via 290 extends through four conductive features. The contact via 292 extends through the fifth conductor plate 278b, the third conductor plate 270b, and the first conductor plate 262b, and in direct contact with the lower contact feature 254. The contact via 294 extends through the fifth dummy conductive feature 278c, the fourth conductor plate 274b and the second conductor plate 266b, and in direct contact with the lower contact feature 255. That is, the contact via 292 and the contact via 294 in the second region 200B each extends through three conductive features.

After forming the contact vias 290, 292 and 294, further processes may be performed. Such further processes may include, for example, forming a dielectric layer 295 (shown in FIG. 18) on the contact vias 290, 292 and 294, patterning the dielectric layer 295 to form a number of openings exposing the contact vias 290, 292 and 294, and forming metal lines 296, 297, and 298 (shown in FIG. 18) in the openings. The formation and composition of the dielectric layer 295 may be in a way similar to those of the second passivation structure 282, the formation and composition of the metal lines 296, 297, and 298 may be in a way similar to those of the contact vias 290, 292 and 294, and repeated description is omitted for reason of simplicity. In some embodiments, the metal lines 296, 297, and 298 may be referred to as upper contact features and may be part of a redistribution layer (RDL) to reroute bond connections between upper and lower layers. Such further processes may also include formation of a third passivation structure over the metal lines 296, 297, and 298, formation of openings through the third passivation structure to expose the metal lines 296, 297, and 298, deposition of one or more polymeric material layers, patterning of the one or more polymeric material layers, deposition of an under-bump-metallurgy (or under-bump-metallization, UBM) layer, deposition of a copper-containing bump layer, deposition of a cap layer, deposition of a solder layer, and reflowing of the solder layer. These further processes form contact structures for connection to external circuitry.

In the above embodiments, the MIM capacitor 280 includes five conductor plates 262b, 266b, 270b, 274b, and 278b, and the first dummy conductive feature 262a is formed along with the first conductor plate 262b, the second dummy conductive feature 266a is formed along with the second conductor plate 266b, the third dummy conductive feature 270a is formed along with the third conductor plate 270b, the fourth and fifth dummy conductive features 278a and 278a are formed along with the fifth conductor plate 278b. However, other configurations are possible. For example, FIG. 19 depicts a schematic illustration of an alternative device structure 200', according to various aspects of the present disclosure.

Figure 19:
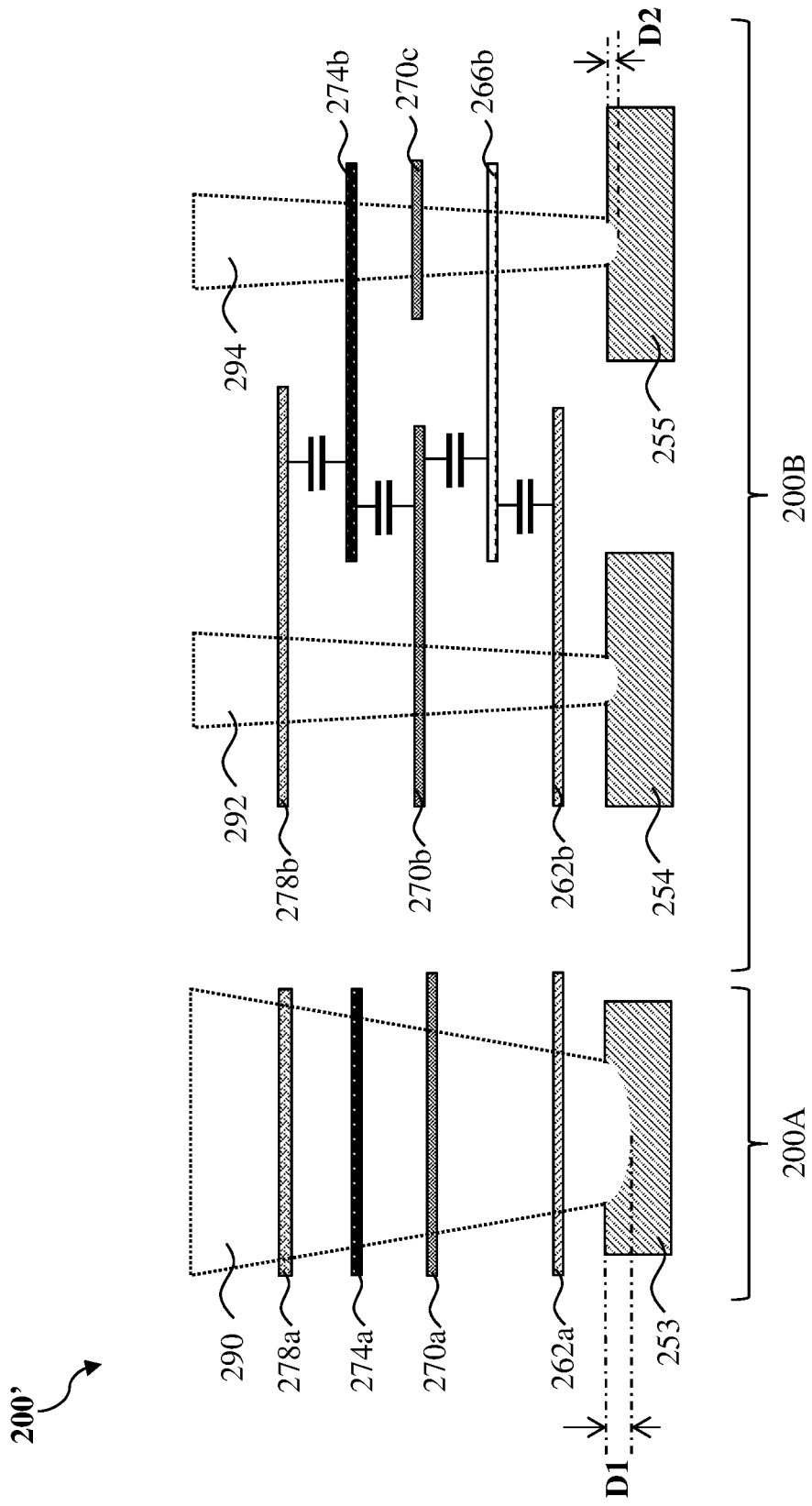
FIG. 19 is a schematic illustration of a first alternative device structure, according to various aspects of the present disclosure.

In embodiments represented in FIG. 19, a device structure 200' includes the contact via 290 in the first region 200A extending through the first dummy conductive feature 262a directly over the lower contact feature 253, the third dummy conductive feature 270a directly over the first dummy conductive feature 262a, a dummy conductive feature 274a directly over the third dummy conductive feature 270a, and the fourth dummy conductive feature 278a directly over the dummy conductive feature 274a. The dummy conductive feature 274a may be formed along with the fourth conductor plate 274b in a way similar to the formation of the first dummy conductive feature 262a and the first conductor plate 262b.

The device structure 200' includes the contact via 292 in the second region 200B extending through the fifth conductor plate 278b, the third conductor plate 270b, and the first conductor plate 262b, and in direct contact with the lower contact feature 254. The device structure 200' also includes the contact via 294 in the second region 200B extending through the fourth conductor plate 274b, a dummy conductive feature 270c, and the second conductor plate 266b, and in direct contact with the lower contact feature 255. The dummy conductive feature 270c may be formed along with the third dummy conductive feature 270a and the third conductor plate 270b. As a result, the contact via 290 in the first region 200A still extends through four conductive features, and each of the contact via 292 and the contact via 294 in the second region 200B still extends through three conductive features. It is understood that the embodiments represented in FIGS. 17 and 19 are merely examples and are not intended to limit the present disclosure to what is explicitly illustrated in FIGS. 17 and 19. For example, the contact via 294 may penetrate the fourth conductor plate 274b, the second conductor plate 266b, and a dummy conductive feature formed along with the first conductor plate 262b and disposed directly over the lower contact feature 255. That is, the dummy conductive feature that is formed directly over the lower contact feature 255 and penetrated through by the contact via 294 may be formed along with any one of the first, third, or fifth conductor plate 262b, 270b, 278b. Similarly, the contact via 290 may penetrate four conductive features that are formed along with any four of the five conductor plates of the MIM capacitor 280.

In the above embodiments, the MIM capacitor 280 includes five conductor plates 262b, 266b, 270b, 274b, and 278b, the contact via 290 in the first region 200A extends through four conductive features, and the contact via in the second region extends through three conductive features. In some other implementations, as represented in FIG. 20, the contact via 290 in the first region 200A of a device structure 200" extends through five conductive features 262a, 266a, 270a, 272a, and 278a, and the contact vias 292 and 294 in the second region 200B each extend through four conductive features. For example, besides the first, third, and fifth conductor plates 262b, 270b, and 278b, the contact via 292 penetrates through a dummy conductive feature (e.g., a dummy conductive feature 274c) that may be formed along with either the second conductor plate 266b or the fourth conductor plate 274b. Besides the second, and fourth conductor plates 266b and 274b, the contact via 294 penetrates through two dummy conductive features (e.g., dummy conductive features 278c and 270c) that may be formed along with any two conductor plates of the first, third, and fifth conductor plates 262b, 270b, and 278b. A depth D1' of a portion of the contact via 290 that extends into the lower contact feature 253 may be greater than a depth D2' of a portion of the contact via 294 that extends into the lower contact feature 255. In some embodiments, the depth D1' may be less than the depth D1, and the depth D2' may be less than the depth D2'.

In the embodiments described above with reference to FIGS. 17, 19, and 20, the contact via 290 in the first region 200A extends through one more conductive feature than that of the contact via (e.g., contact via 292, contact via 294) in the second region 200B. FIG. 21 depicts another alternative device structure 200‴. In an embodiment, as represented by FIG. 21, the contact via 290 in the first region 200A may extend through two more conductive features than that of the contact via (e.g., contact via 292, contact via 294) in the second region 200B. More specifically, the contact via 290 in the first region 200A extends through five conductive features, and each of the contact via in the second region 200B extends through three conducive features. In embodiments represented in FIG. 21, a depth D1' of a portion of the contact via 290 that extends into the lower contact feature 253 may be greater than the depth D2 and less than the depth D1 (shown in FIG. 17). That is, D2<D1"<D1. Comparing to the embodiment represented in FIGS. 13-20, providing one more extra conductive feature over the lower contact feature 253 further reduces the extent at which the lower contact feature 253 in the first region 200A would be etched during the etching process 285.

While the MIM capacitor 280 depicted in the present disclosure includes five conductor plates, an MIM capacitor according to the present disclosure may include any suitable number of conductor plates. For example, the MIM capacitor may include 3, 4, 6, or even more conductor plates. Adjacent conductor plates are insulated from one another by an insulator layer. In embodiments where the MIM capacitor includes three conductor plates, each of the contact vias in the second region 200B may penetrate through two conductive features (e.g., two conductor plates or a combination of a conductor plate and a dummy conductive feature), and the contact via in the first region 200A may penetrate through three conductive features. As such, the contact via in the first region 200A penetrates through one more conductive feature than that of the contact via in the second region 200B. In embodiments where the MIM capacitor includes three, four, six, or other numbers of conductor plates, one of ordinary skill in the art should realize that the teachings of the above embodiments can be applied to configure the conductor plates, the dummy conductive features and contact vias in the first region 200A and second region 200B.

FIG. 22 depicts an alternative method 300 of reducing the over etch of the lower contact features. In the present embodiments, after providing the workpiece 200 shown in FIG. 2, method 300 is applied to the workpiece 200 to fabricate a device structure. For ease of description, the workpiece 200 shown in FIG. 2 in this embodiment will be referred to as a workpiece 400, and the workpiece 400 includes a first region 200A and a second region 200B. Method 300 is described below in conjunction with FIGS. 23-29, which are fragmentary cross-sectional views of a workpiece at different stages of fabrication in method 300.

Figure 23:
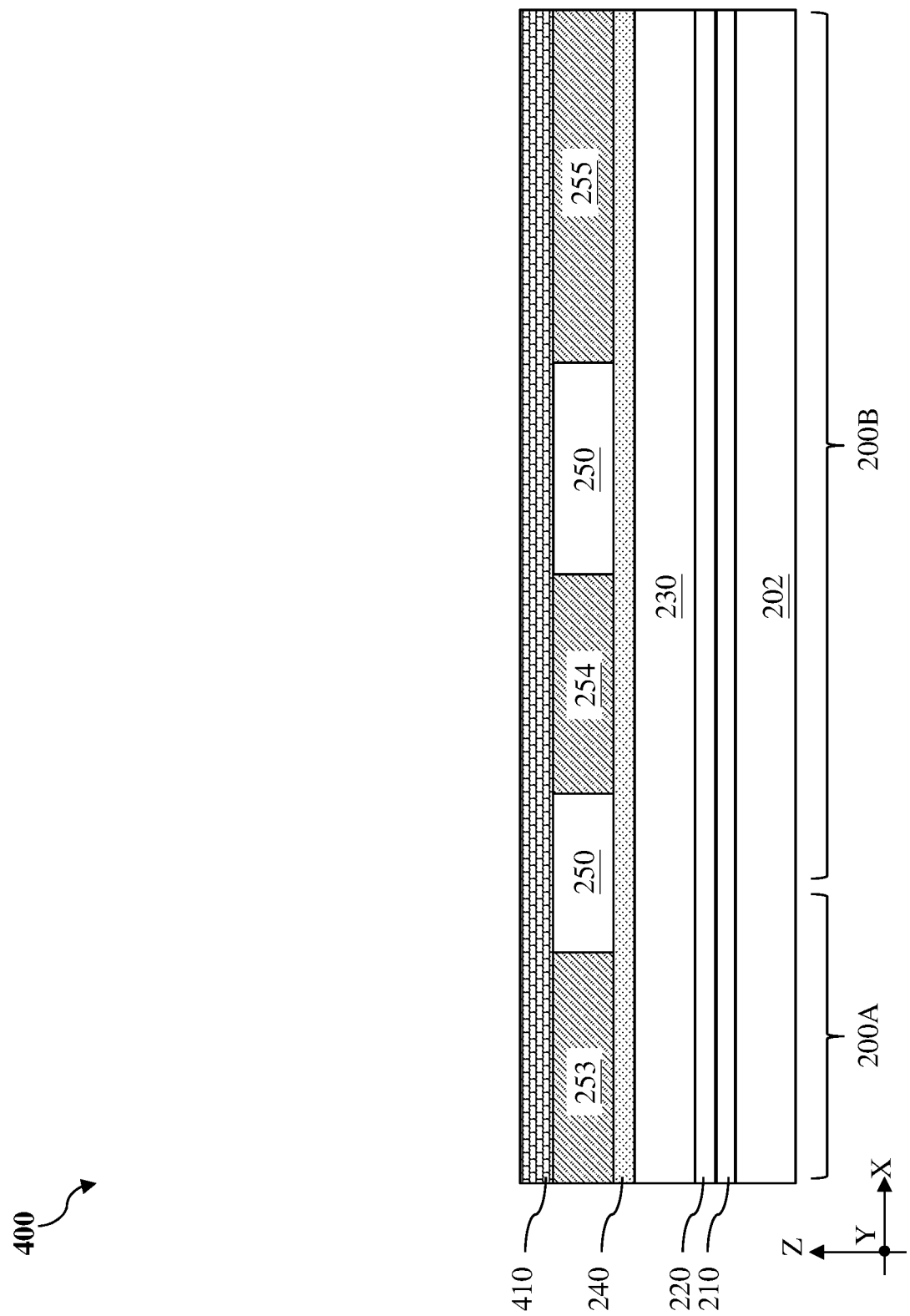
FIGS. 23, 24, 25, 26, and 27 are fragmentary cross-sectional views of a workpiece during various fabrication stages in the method of FIG. 22, according to various aspects of the present disclosure.

Referring to FIGS. 22 and 23, method 300 includes a block 310 where a second etch stop layer 410 is formed directly on the first dielectric layer 250. In an embodiment, the second etch stop layer 410 is deposited on the first dielectric layer 250 by chemical vapor deposition (CVD), physical vapor deposition (PVD), atomic layer deposition (ALD), or combinations thereof. The second etch stop layer 410 may include silicon carbonitride (SiCN), silicon nitride (SiN), other suitable materials, or combinations thereof. In the present embodiments, the second etch stop layer 410 is in direct contact with top surfaces of the lower contact features 253, 254, and 255.

Figure 24:
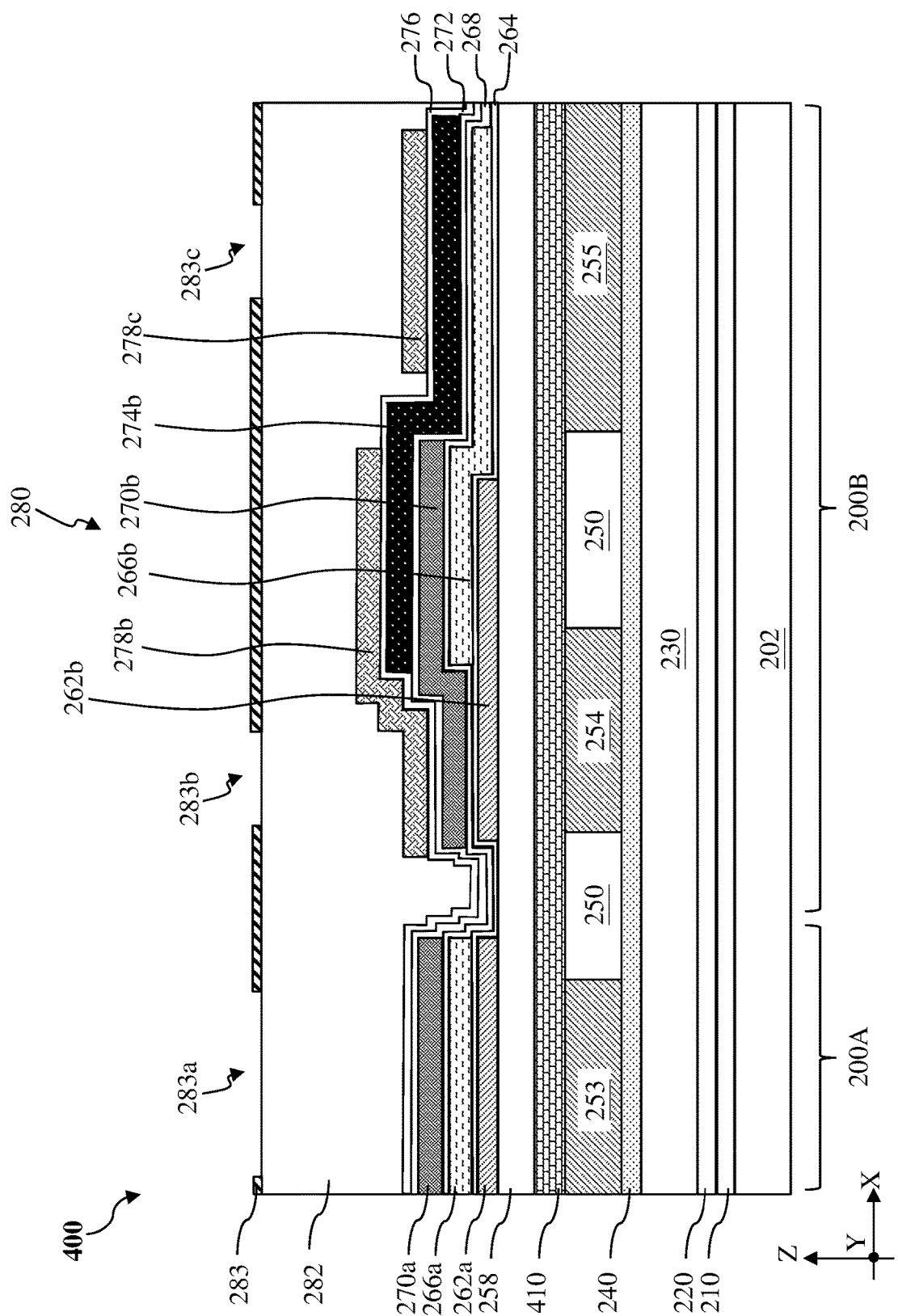

Referring to FIGS. 22 and 24, method 300 includes a block 320 where operations in blocks 104-120 of method 100 are performed. In embodiments represented in FIG. 24, after performing the operations in blocks 104-120 of method 100, the workpiece 400 includes the first passivation structure 258 formed directly on the second etch stop layer 410, the first, second, and third dummy conductive features 262a, 266a, and 270a formed directly over the lower contact feature 253 in the first region 200A, the first conductor plate 262b, second conductor plate 266b, third conductor plate 270b, and fourth conductor plate 274b formed in the second region 200B. Two adjacent conductor plates are isolated by an insulator layer.

Still referring to FIGS. 22 and 24, method 300 includes a block 330 where a fifth conductor plate 278b is formed directly over the lower contact feature 254 and a dummy conductive feature 278c is formed directly over the lower contact feature 255. The formation of the fifth conductor plate 278b and the dummy conductive feature 278c may include depositing a conductive layer over the workpiece 400 and patterning the conductive layer to form the fifth conductor plate 278b and the dummy conductive feature 278c. The MIM capacitor 280 is formed upon the formation of the fifth conductor plate 278b. Different from the workpiece 200 shown in FIG. 13, in the present embodiment in FIG. 24, upon the formation of the MIM capacitor 280, there are three dummy conductive features formed directly over the lower contact feature 253 in the first region 200A. After forming the MIM capacitor 280 and the number of dummy conductive features, the second passivation structure 282 and the patterned mask film 283 may be then formed. Repeated description of the formations of the second passivation structure 282 and the patterned mask film 283 are omitted for reason of simplicity.

Figure 25:
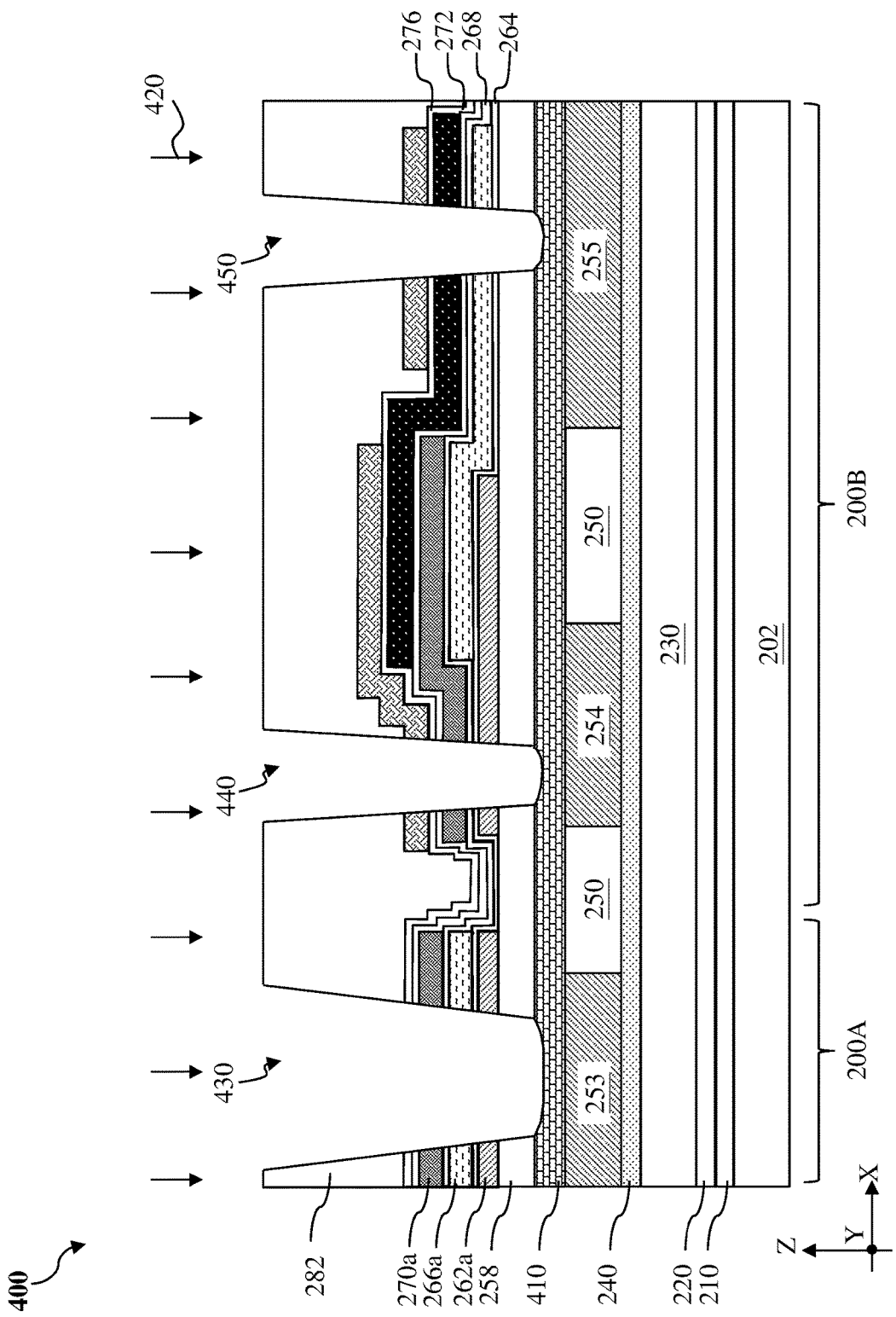

Referring to FIGS. 22 and 25, method 300 includes a block 340 where a first etching process 420 is performed to form openings 430, 440, and 450 penetrating through multiple layers in the first region 200A and the second region 200B. In the present embodiments, the first etching process 420 selectively removes portions of the second passivation structure 282 exposed by the openings 283a, 283b, 283c and features thereunder without substantially etching the second etch stop layer 410. That is, forming the second etching stop layer 410 may advantageously reduce the depth difference between a depth of the opening 430 and a depth of the opening 440 caused by the loading effect in the first region 200A and in the second region 200B. In an embodiment, the first etching process 420 slightly etches a first portion of the second etch stop layer 410 under the opening 283a and slightly etches a second portion of the second etch stop layer 410 under the opening 283c. In an embodiment, a thickness of the first portion of the second etch stop layer 410 is greater than a thickness of the second portion of the second etch stop layer 410.

Figure 26:
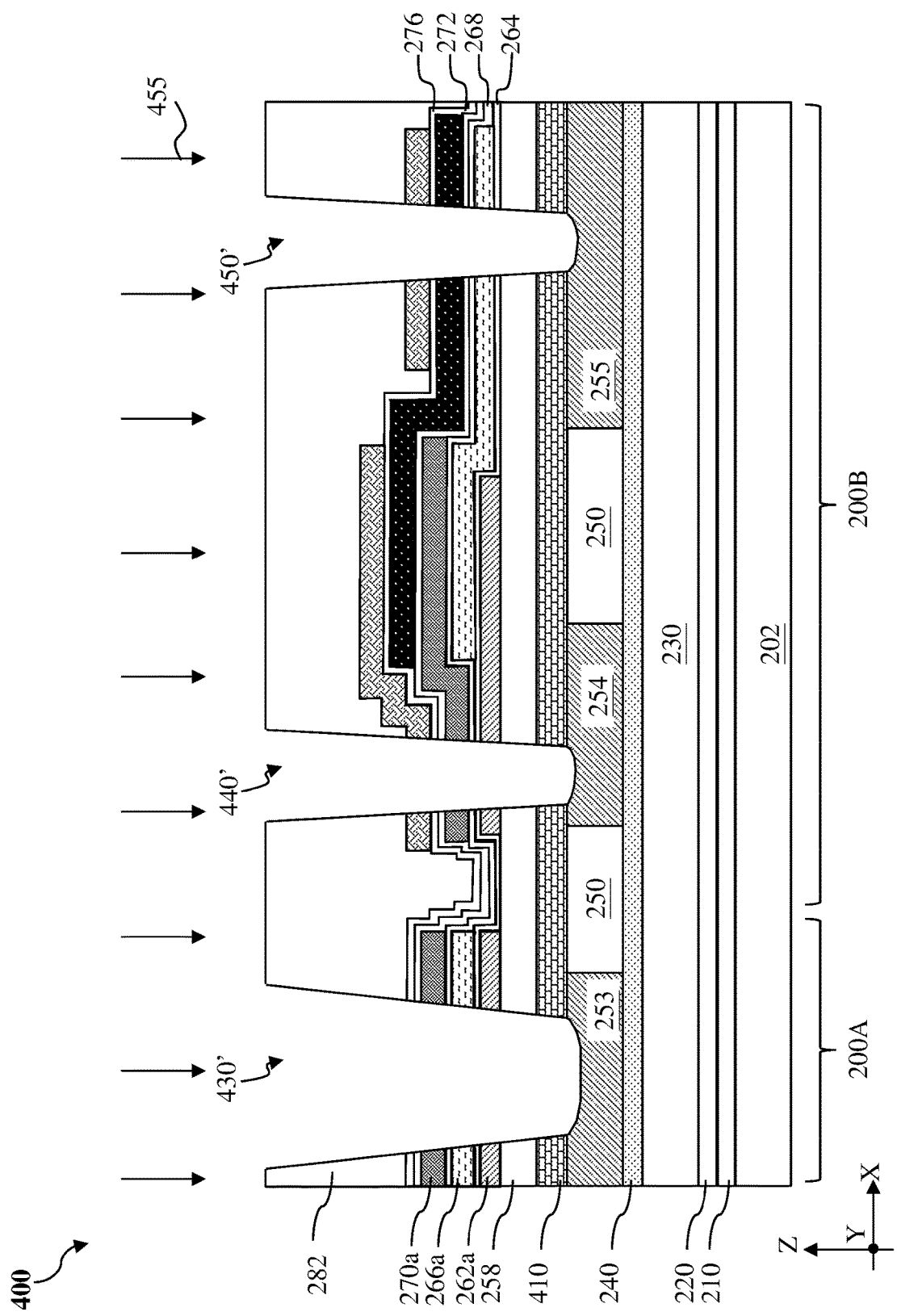

Referring to FIGS. 22 and 26, method 300 includes a block 350 where a second etching process 455 is performed to vertically extend the openings 430, 440, and 450 to expose the lower contact features 253, 254, and 255, respectively. The extended openings 430, 440, and 450 may also be referred to as openings 430', 440', and 450'. The second etching process 455 selectively etches the second etch stop layer 410. In an embodiment, a thickness of the second etch stop layer 410 is less than a total thickness of features formed on the second etch stop layer 410. As such, the second etching process 455 may be performed at a shorter duration than that of the first etching process 420. As such, even if there is still a loading effect during the performing of the second etching process 455, the extent at which the lower contact feature 253 being etched is less than that of a lower contact feature in a workpiece which doesn't include the second etch stop layer. As a result, the over etch of the lower contact feature 253 may be advantageously reduced.

Figure 27:
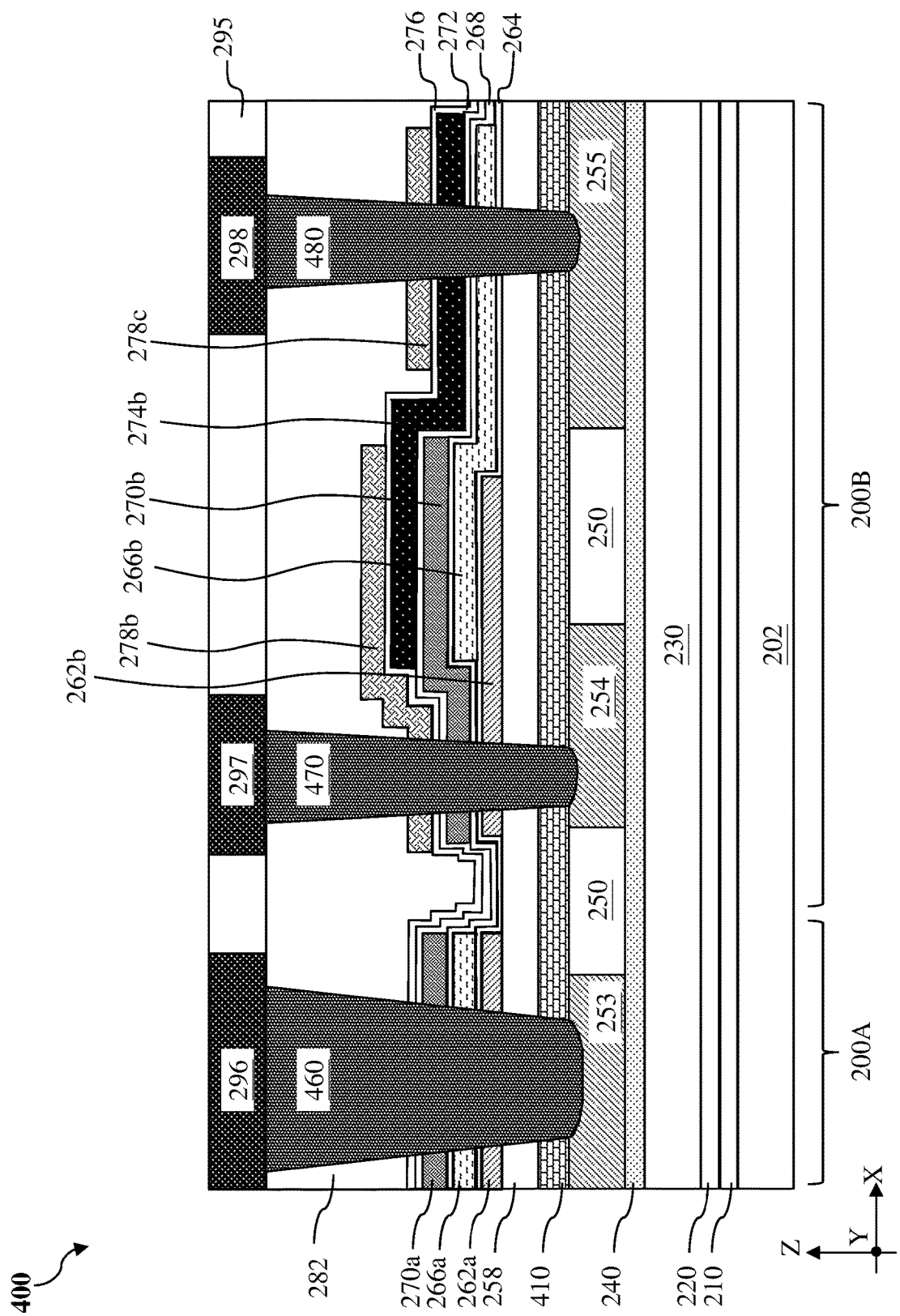

Referring to FIGS. 22 and 27, method 300 includes a block 360 where contact vias 460, 470, and 480 are formed in the openings 430', 440', and 450'. The contact vias 460, 470, and 480 track the shapes of the openings 430', 440', and 450', respectively. In the present embodiments, each of the contact vias 460, 470, and 480 is in direct contact with three conductive features, as represented in FIG. 27. It is understood that the configurations of the dummy conductive features penetrated by the contact vias may be different, as described above with reference to FIGS. 17 and 19. The formation and composition of the contact vias 460, 470, and 480 may be in a way similar to those of the contact vias 290, 292, and 294, and repeated description is omitted for reason of simplicity. Further processes may be performed to finish the fabrication process of the device structure 400.

Figure 28:
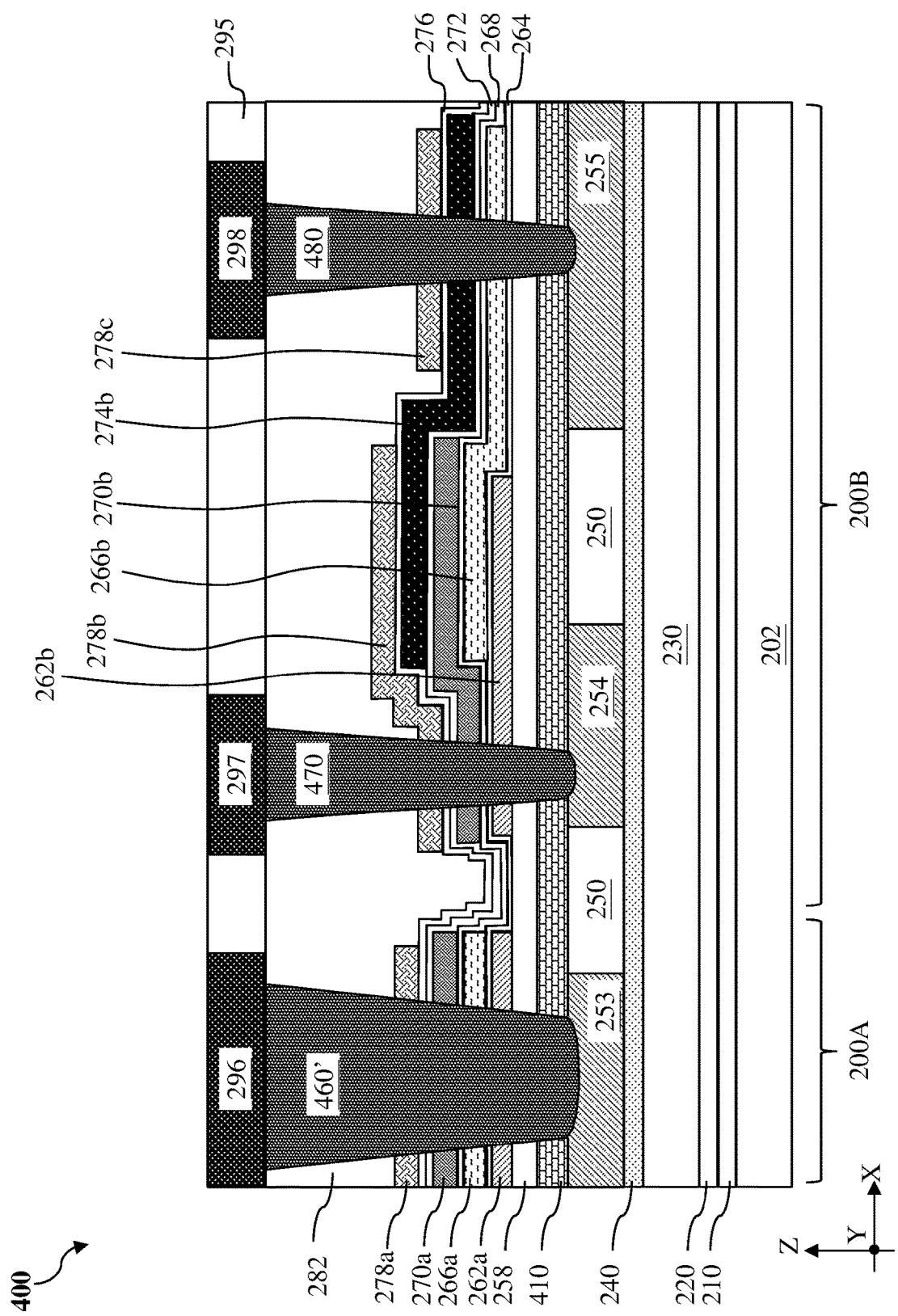
FIG. 28 is fragmentary cross-sectional view of a fourth alternative device structure, according to various aspects of the present disclosure.
Figure 29:
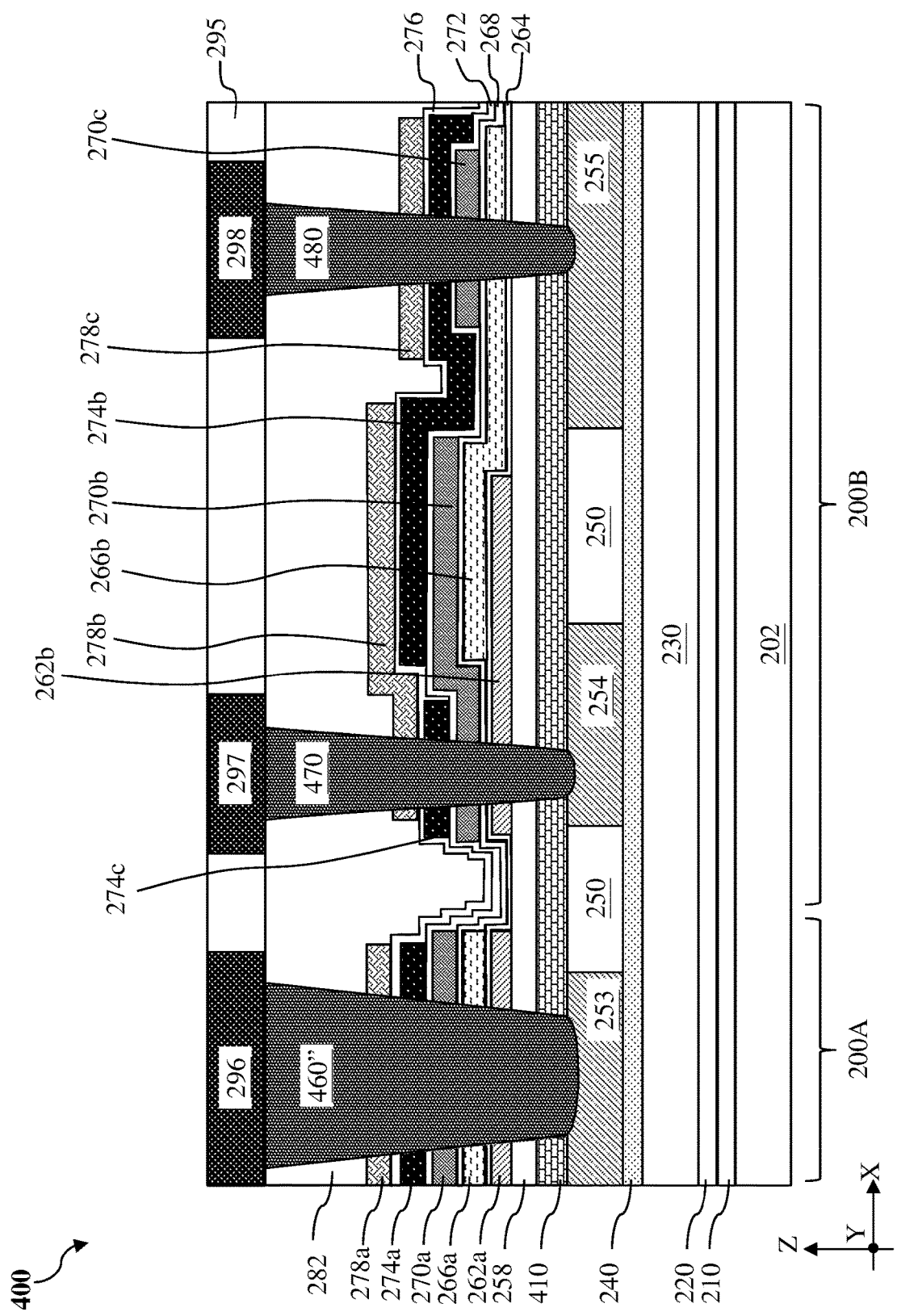
FIG. 29 is fragmentary cross-sectional view of a fifth alternative device structure, according to various aspects of the present disclosure.

In some embodiments, the over etch of the lower contact features may be further reduced. FIG. 28 and FIG. 29 each illustrate a cross-sectional view of an alternative device structure, according to various aspects of the present disclosure. In embodiments represented in FIG. 28 and FIG. 29, the workpiece 400 includes the second etch stop layer 410 and further includes different numbers of conductive features in the first region 200A and in the second region 200B. For example, as shown in FIG. 28, the contact via 460' in the first region 200A extends through four dummy contact features, and each of the contact vias 470 and 480 in the second region 200B extends through three dummy conductive features. In embodiments represented in FIG. 29, the contact via 460" in the first region 200A extends through five dummy conductive features, and each of the contact vias 470 and 480 in the second region 200B extends through four dummy conductive features. In some embodiments, the contact via 460" in the first region 200A may extend through five dummy conductive features, and each of the contact vias 470 and 480 in the second region 200B may extend through three dummy conductive features As described above with reference to FIGS. 15-21, providing different numbers of conductive features to be penetrated by contact vias formed in different regions may advantageously reduce the loading effect and thus reduce the over etch of the lower contact features in the first region 200A.

The present disclosure provides for many different embodiments. Semiconductor structures and methods of fabrication thereof are disclosed herein. In one exemplary aspect, the present disclosure is directed to a semiconductor structure. The semiconductor structure includes a substrate including a first region and a second region, a first lower contact feature and a second lower contact feature in a dielectric layer and directly over the first region and the second region, respectively, a first vertical stack of conductive features disposed over the first region, a metal-insulator-metal (MIM) capacitor disposed over the second region and comprising a vertical stack of conductor plates, a first contact via extending through the first vertical stack of conductive features and electrically coupled to the first lower contact feature, and a second contact via extending through a portion of the vertical stack of conductor plates and electrically coupled to the second lower contact feature, a number of conductive features penetrated by the first contact via is different than a number of conductor plates penetrated by the second contact via.

In some embodiments, the number of conductive features penetrated by the first contact via may be greater than the number of conductor plates penetrated by the second contact via. In some embodiments, the MIM capacitor may include a number of M conductor plates, the first vertical stack of conductive features may include a number of N conductive features, M≥N>1. In some embodiments, the vertical stack of conductor plates may include a first conductor plate, a second conductor plate, a third conductor plate, a fourth conductor plate, and a fifth conductor plate stacked bottom to up, and the second contact via may extend through the fifth conductor plate, the third conductor plate, and the first conductor plate. In some embodiments, the semiconductor structure may also include a third lower contact feature in the dielectric layer and directly over the second region, a second vertical stack of conductive features disposed over the second region and electrically isolated from the MIM capacitor, and a third contact via extending through a remaining portion of the vertical stack of conductor plates and one or more contact features of the second vertical stack of conductive features, and electrically coupled to the third lower contact feature. A total number of conductor plates and conductive features penetrated by the third contact via may be equal to the number of conductor plates penetrated by the second contact via. In some embodiments, the second vertical stack of conductive features may include a part disposed directly over the second lower contact feature, and the second contact via may further extend through one or more conductive features of the part of the second vertical stack of conductive features. In some embodiments, a width of the first contact via may be greater than a width of the second contact via. In some embodiments, the semiconductor structure may also include an etch stop layer disposed on the dielectric layer and in direct contact with the first lower contact feature and the second lower contact feature. The first contact via and the second contact via each may further extend through etch stop layer.

In another exemplary aspect, the present disclosure is directed to a semiconductor structure. The semiconductor structure includes a substrate comprising a first region and a second region, a first lower contact feature in a dielectric layer and disposed directly over the first region, a second lower contact feature in the dielectric layer and directly over the second region, a passivation structure over the dielectric layer and comprising N dummy conductive features over the first region and a metal-insulator-metal (MIM) capacitor over the second region, the MIM capacitor having M conductor plates, a first contact via penetrating the passivation structure and in direct contact with the first lower contact feature and each of the N dummy conductive features, M≥N>1, and a second contact via penetrating the passivation structure and in direct contact with the second lower contact feature and M' conductor plates of the M conductor plates, N>M'>0.

In some embodiments, M=5, N=5, M'=3. In some embodiments, M=5, N=4, M'=3. In some embodiments, a top surface of the first contact via may be coplanar with a top surface of the second contact via, and a height of the first contact via may be different than a height of the second contact via. In some embodiments, the first lower contact feature and the second lower contact feature each may include a concave top surface. In some embodiments, the first contact via may span a width greater than a width of the second contact via. In some embodiments, the MIM capacitor may include a bottom plate on the dielectric layer and directly over the second lower contact feature, a first insulator layer over the bottom plate, a middle plate over the first insulator layer, a second insulator layer over the middle plate, and a top plate over the second insulator layer and directly over the second lower contact feature. The second contact via may extend through the top plate and the bottom plate. In some embodiments, the N dummy conductive features may include a first dummy conductive feature directly over the first lower contact feature, a second dummy conductive feature directly over both the first dummy conductive feature and the first lower contact feature, and a third dummy conductive feature directly over both the second dummy conductive feature and the first lower contact feature. The first dummy conductive feature and the bottom plate may have the same composition and thickness, the second dummy conductive feature and the middle plate may have the same composition and thickness, and the third dummy conductive feature and the top plate may have the same composition and thickness.

In yet another exemplary aspect, the present disclosure is directed to a method structure. The method includes receiving a workpiece including a first contact feature and a second contact feature embedded in a dielectric layer, depositing a first conductive layer over the dielectric layer, patterning the first conductive layer to form a first dummy conductive feature over the first contact feature and a first conductor plate over the second contact feature, depositing a first insulation layer over the workpiece, depositing a second conductive layer over the first insulation layer, patterning the second conductive layer to form a second dummy conductive feature over the first dummy conductive feature and a second conductor plate over the first conductor plate, depositing a second insulation layer over the workpiece, depositing a third conductive layer over the second insulation layer, patterning the third conductive layer to form a third dummy conductive feature over the second dummy conductive feature and a third conductor plate over the second conductor plate, forming a first contact via extending through the third dummy conductive feature, the second insulation layer, the second dummy conductive feature, the first insulation layer, and the third dummy conductive feature to electrically couple to the first contact feature, and forming a second contact via extending through the third conductor plate, the second insulation layer, the first insulation layer, and the first conductor plate to electrically couple to the second contact feature.

In some embodiments, the workpiece may also include a third contact feature embedded in the dielectric layer, and the patterning of the third conductive layer may also form a fourth dummy conductive feature directly over the second conductor plate and the second contact feature. In some embodiments, the method may also include forming a third contact via extending through the fourth dummy conductive feature, the second insulation layer, the second conductor plate, the first insulation layer, and the first conductor plate to electrically couple to the second contact feature. In some embodiments, a width of the first contact via may be greater than a width of the second contact via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate comprising a first region and a second region;
   a first lower contact feature and a second lower contact feature in a dielectric layer and directly over the first region and the second region, respectively;
   first conductive features disposed over the first region;
   second conductive features disposed over the second region, physically separated from the first conductive features, and comprising conductor plates of a metal-insulator-metal (MIM) capacitor and dummy plates physically separated from the conductor plates;
   a first contact via extending through the first conductive features and electrically coupled to the first lower contact feature; and
   a second contact via extending through a part of the conductor plates and at least one of the dummy plates and electrically coupled to the second lower contact feature,
   wherein a number of the first conductive features penetrated by the first contact via is greater than a number of the second conductive features penetrated by the second contact via.

2. The semiconductor structure of claim 1, wherein the MIM capacitor comprises a number of M conductor plates, the first conductive features comprise a number of N conductive features, wherein M≥N>1.

3. The semiconductor structure of claim 2, wherein the conductor plates of the MIM capacitor comprises a first conductor plate, a second conductor plate, a third conductor plate, a fourth conductor plate, and a fifth conductor plate stacked bottom to up, and the second contact via extends through the fifth conductor plate, the third conductor plate, and the first conductor plate.

4. The semiconductor structure of claim 2, further comprising:
   a third lower contact feature in the dielectric layer and directly over the second region; and
   a third contact via extending through a remaining part of the conductor plates,
   wherein the second contact via and the third contact via penetrate a same number of conductive features of the second conductive features.

5. The semiconductor structure of claim 1, a width of the first contact via is greater than a width of the second contact via.

6. A semiconductor structure, comprising:
   a substrate comprising a first region and a second region;
   a first lower contact feature in a dielectric layer and disposed directly over the first region;
   a second lower contact feature in the dielectric layer and directly over the second region;
   an integrated structure over the dielectric layer and comprising N first dummy conductive features over the first region and a metal-insulator-metal (MIM) capacitor and D second dummy conductive features over the second region, the MIM capacitor having M conductor plates, wherein D >0;
   a first contact via penetrating the integrated structure and in direct contact with the first lower contact feature and each of the N first dummy conductive features, M≥N>1;
   a second contact via penetrating the integrated structure and in direct contact with the second lower contact feature and M' conductor plates of the M conductor plates, wherein N>M'>0,
   wherein N is greater than a sum of M' and a number of the D second dummy conductive features penetrated by the second contact via.

7. The semiconductor structure of claim 6, wherein M=5, M'=2.

8. The semiconductor structure of claim 6, wherein a top surface of the first contact via is coplanar with a top surface of the second contact via, and a depth of the first contact via is different than a depth of the second contact via.

9. The semiconductor structure of claim 6, wherein the first lower contact feature and the second lower contact feature each comprises a concave top surface.

10. The semiconductor structure of claim 6, wherein the first contact via spans a width greater than a width of the second contact via.

11. The semiconductor structure of claim 6, wherein the MIM capacitor comprises:
    a bottom plate on the dielectric layer and directly over the second lower contact feature,
    a first insulator layer over the bottom plate,
    a middle plate over the first insulator layer,
    a second insulator layer over the middle plate, and
    a top plate over the second insulator layer and directly over the second lower contact feature, and
    wherein the second contact via extends through the top plate and the bottom plate.

12. The semiconductor structure of claim 11, wherein the N first dummy conductive features comprise:
    a first dummy conductive feature directly over the first lower contact feature;
    a second dummy conductive feature directly over both the first dummy conductive feature and the first lower contact feature; and
    a third dummy conductive feature directly over both the second dummy conductive feature and the first lower contact feature,
    wherein the first dummy conductive feature and the bottom plate have the same composition and thickness,
    wherein the second dummy conductive feature and the middle plate have the same composition and thickness, and wherein the third dummy conductive feature and the top plate have the same composition and thickness.

13. A semiconductor structure, comprising:
   a metal-insulator-metal (MIM) capacitor having M conductor plates;
   a first conductive feature disposed under the MIM capacitor;
   a dummy conductive feature physically isolated from conductor plates of the MIM capacitor,
   a first via disposed over the first conductive feature and electrically coupling the MIM capacitor to the first conductive feature, a top surface of the first via having a first width, wherein a portion of the first via extends into the first conductive feature and has a first depth, wherein the first via extends through the dummy conductive feature and M' conductor plates of the M conductor plates, M' is a positive integer and is less than M;
   a plurality of vertically stacked conductive layers adjacent to the MIM capacitor, wherein a number of the plurality of vertically stacked conductive layers is greater than M', and a difference between the number of the plurality of vertically stacked conductive layers and M' is greater than 1;
   a second conductive feature disposed under the plurality of vertically stacked conductive layers, wherein a top surface of the first conductive feature is substantially coplanar with a top surface of the second conductive feature; and
   a second via extending through the plurality of vertically stacked conductive layers to contact the second conductive feature, a top surface of the second via having a second width, wherein a portion of the second via extends into the second conductive feature and has a second depth;
   wherein the second depth is greater than the first depth, and the second width is greater than the first width.

14. The semiconductor structure of claim 13, wherein the number of the plurality of vertically stacked conductive layers is less than M.

15. The semiconductor structure of claim 13, wherein each of the first via and the second via has a curved bottom surface.

16. The semiconductor structure of claim 13, wherein a composition and a thickness of one of the plurality of vertically stacked conductive layers are the same as a composition and a thickness of a conductor plate of the MIM capacitor.

17. The semiconductor structure of claim 13, wherein the MIM capacitor further comprises a plurality of dielectric layers interleaving the M conductor plates, and
   wherein two adjacent conductive layers of the plurality of vertically stacked conductive layers are separated by one or more dielectric layers of the plurality of dielectric layers.

18. The semiconductor structure of claim 13, further comprising:
   a third conductive feature disposed under the MIM capacitor and adjacent to the first conductive feature; and
   a third via extending through M" conductor plates of the M conductor plates electrically coupling the MIM capacitor to the third conductive feature, wherein M" is different from M'.

19. The semiconductor structure of claim 13, wherein M=5.

20. The semiconductor structure of claim 13, wherein the number of the plurality of vertically stacked conductive layers is less than or equal to M.

* * * * *